United States Patent
Hatori

(10) Patent No.: US 10,818,580 B2
(45) Date of Patent: Oct. 27, 2020

(54) ELECTRONIC COMPONENT DEVICE

(71) Applicant: SHINKO ELECTRIC INDUSTRIES CO., LTD., Nagano-shi, Nagano (JP)

(72) Inventor: Yukinori Hatori, Nagano (JP)

(73) Assignee: SHINKO ELECTRIC INDUSTRIES CO., LTD., Nagano-Shi (JP)

(*) Notice: Subject to any disclaimer, the term of this patent is extended or adjusted under 35 U.S.C. 154(b) by 25 days.

(21) Appl. No.: 16/028,735

(22) Filed: Jul. 6, 2018

(65) Prior Publication Data
US 2019/0013262 A1    Jan. 10, 2019

(30) Foreign Application Priority Data
Jul. 7, 2017  (JP) ................ 2017-133444

(51) Int. Cl.
*H01L 23/495*    (2006.01)
*H01L 23/00*    (2006.01)
(Continued)

(52) U.S. Cl.
CPC .... *H01L 23/49537* (2013.01); *H01L 21/4825* (2013.01); *H01L 23/3107* (2013.01); *H01L 23/3121* (2013.01); *H01L 23/3142* (2013.01); *H01L 23/49503* (2013.01); *H01L 23/49541* (2013.01); *H01L 23/49562* (2013.01); *H01L 23/49582* (2013.01); *H01L 23/49586* (2013.01); *H01L 24/33* (2013.01); *H01L 24/83* (2013.01); *H01L 23/051* (2013.01); *H01L 23/49513* (2013.01); *H01L 24/05* (2013.01); *H01L 24/29* (2013.01); *H01L 24/32* (2013.01); *H01L 2224/04026* (2013.01); *H01L 2224/26175* (2013.01); *H01L 2224/2732* (2013.01); *H01L 2224/29005* (2013.01); *H01L 2224/29007* (2013.01); *H01L 2224/29026* (2013.01);

(Continued)

(58) Field of Classification Search
None
See application file for complete search history.

(56) References Cited

U.S. PATENT DOCUMENTS 5,205,036 A * 4/1993 Yamazaki ........... H01L 24/48 29/856
5,817,544 A * 10/1998 Parthasarathi ...... H01L 23/10 438/123
6,307,755 B1 * 10/2001 Williams ........... H01L 23/4334 361/813
7,830,024 B2 * 11/2010 Kim .................. H01L 21/568 257/784

(Continued)

FOREIGN PATENT DOCUMENTS

| JP | H11121673 | * 10/1997 |
| JP | 2004-332105 | 11/2004 |
| JP | 2006-501675 | 1/2006 |

*Primary Examiner* — Nishath Yasmeen
(74) *Attorney, Agent, or Firm* — Rankin, Hill & Clark LLP

(57) ABSTRACT

An electronic component device includes a first lead frame having a first connection terminal and an electronic component. The first connection terminal includes a first metal electrode, a first pad part formed on an upper surface of the first metal electrode and formed by a metal plated layer, and a first metal oxide layer formed on an upper surface of the first metal electrode in a surrounding region of the first pad part so as to surround an outer periphery of the first pad part. The electronic component has a first terminal part provided on its lower surface. The first terminal part of the electronic component is connected to the first pad part of the first connection terminal via a metal joining material.

20 Claims, 31 Drawing Sheets

(51) Int. Cl.
  *H01L 23/31* (2006.01)
  *H01L 21/48* (2006.01)
  *H01L 23/051* (2006.01)
(52) U.S. Cl.
  CPC ............... *H01L 2224/29034* (2013.01); *H01L 2224/29111* (2013.01); *H01L 2224/29116* (2013.01); *H01L 2224/29139* (2013.01); *H01L 2224/32245* (2013.01); *H01L 2224/3303* (2013.01); *H01L 2224/33181* (2013.01); *H01L 2224/40245* (2013.01); *H01L 2224/73263* (2013.01); *H01L 2224/8314* (2013.01); *H01L 2224/83192* (2013.01); *H01L 2224/83203* (2013.01); *H01L 2224/83439* (2013.01); *H01L 2224/83444* (2013.01); *H01L 2224/83464* (2013.01); *H01L 2224/83815* (2013.01); *H01L 2224/83911* (2013.01); *H01L 2924/014* (2013.01); *H01L 2924/13091* (2013.01)

(56) References Cited

U.S. PATENT DOCUMENTS

| | | | | |
|---|---|---|---|---|
| 8,129,229 | B1* | 3/2012 | Sirinorakul | H01L 23/4951 257/666 |
| 9,478,484 | B2* | 10/2016 | Otremba | H01L 23/49548 |
| 9,806,029 | B2* | 10/2017 | Otremba | H01L 23/4334 |
| 9,824,960 | B2* | 11/2017 | Ishibashi | H01L 23/49586 |
| 2004/0063240 | A1 | 4/2004 | Madrid et al. | |
| 2004/0207056 | A1* | 10/2004 | Seki | H01L 24/48 257/676 |
| 2007/0085178 | A1 | 4/2007 | Seki et al. | |
| 2008/0150064 | A1* | 6/2008 | Zimmerman | H01L 23/10 257/433 |
| 2016/0172283 | A1* | 6/2016 | Cho | H01L 23/49562 257/76 |
| 2017/0025329 | A1* | 1/2017 | Ishibashi | H01L 23/3142 |

* cited by examiner

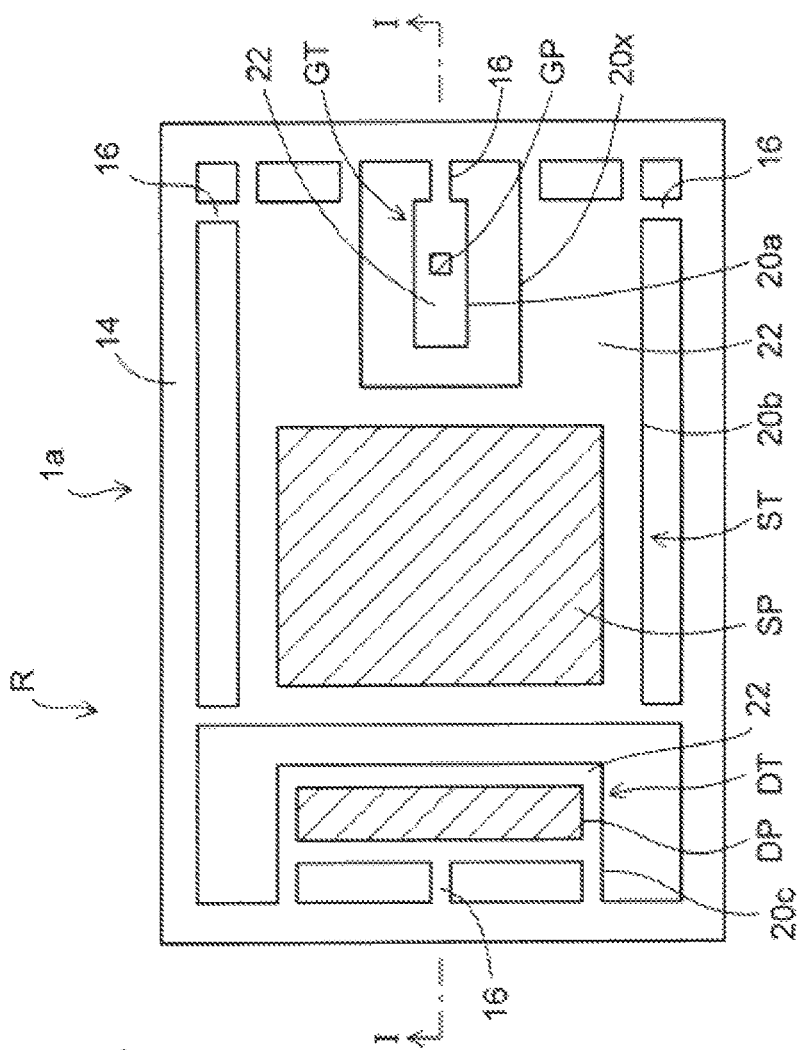
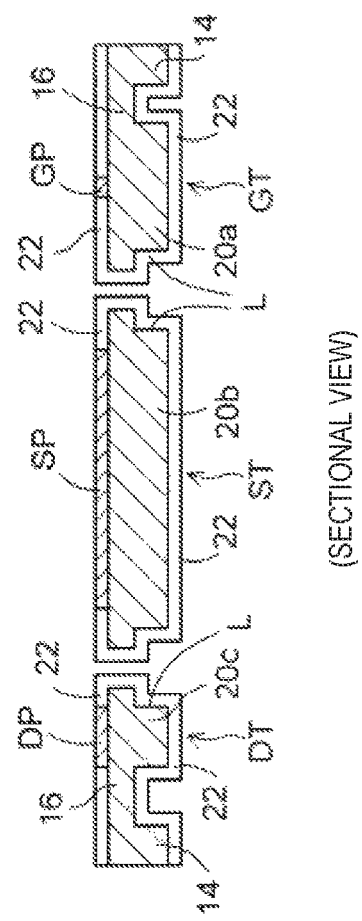
FIG. 4A
FIG. 4B (COMPARATIVE EXAMPLE 1)

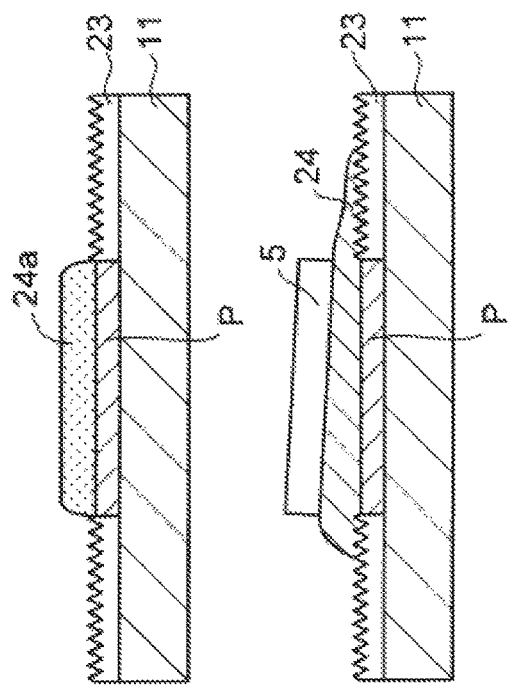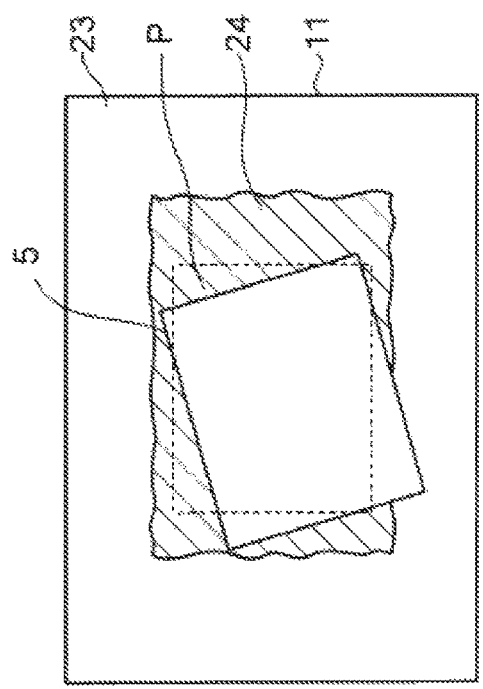

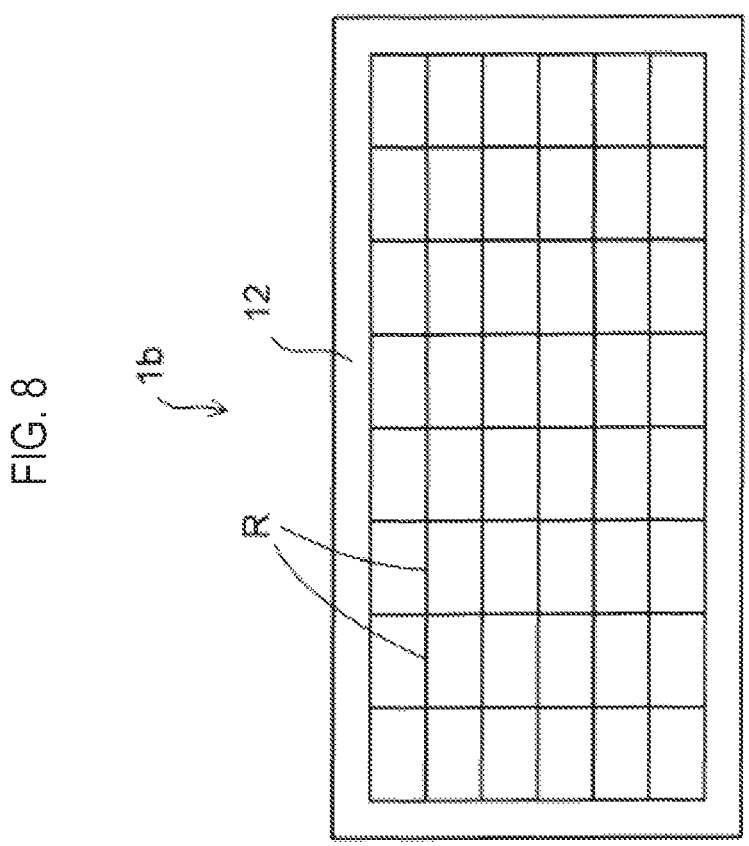

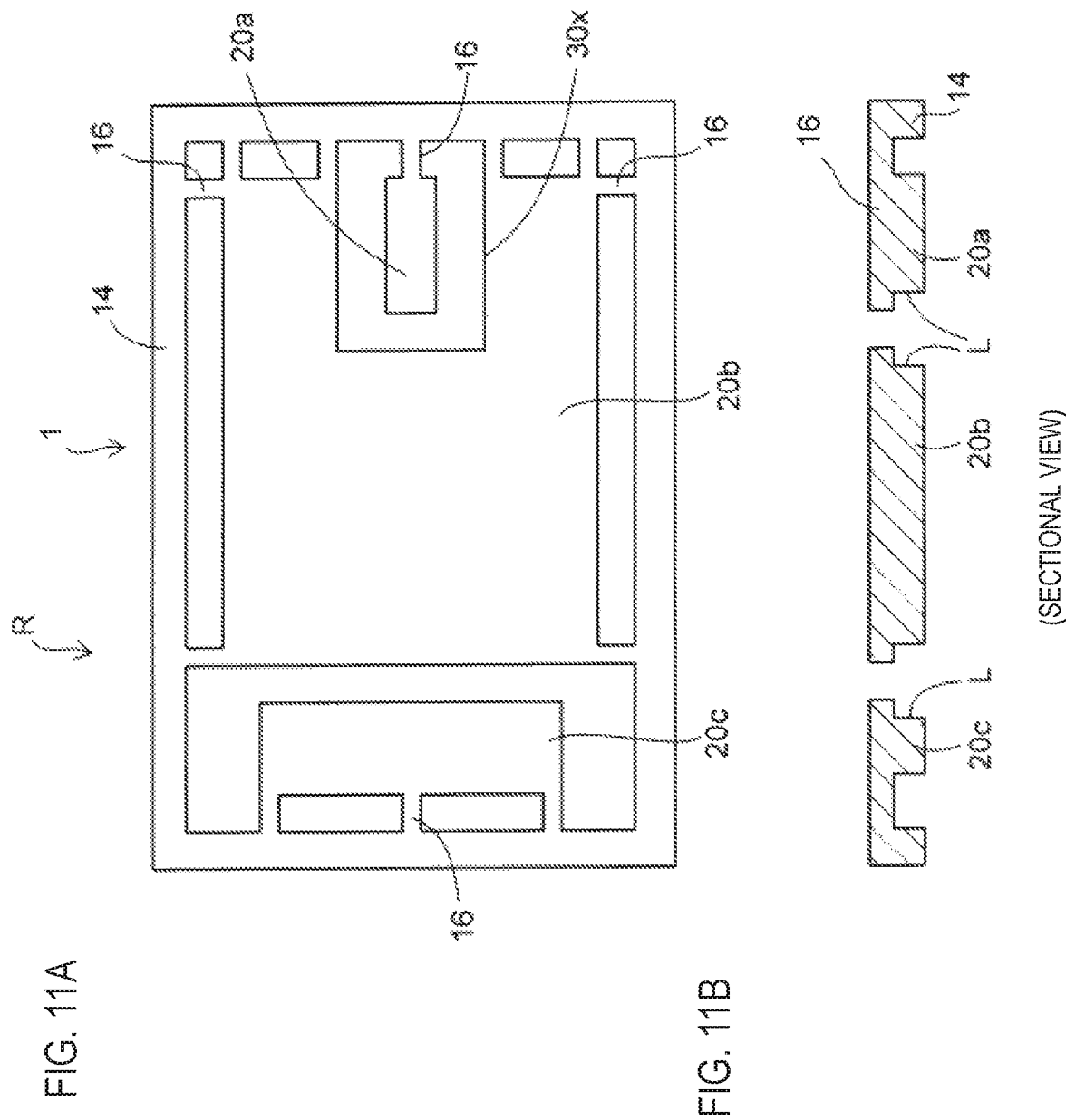

FIG. 12B (SECTIONAL VIEW)

(SECTIONAL VIEW)

(SECTIONAL VIEW)

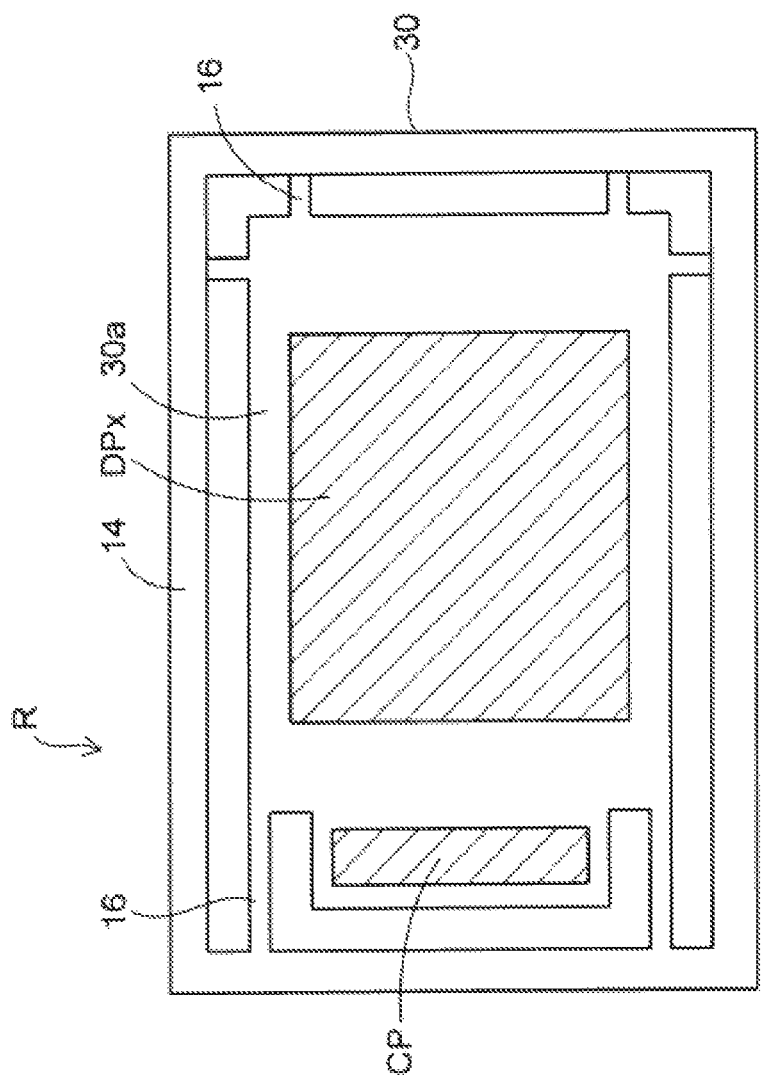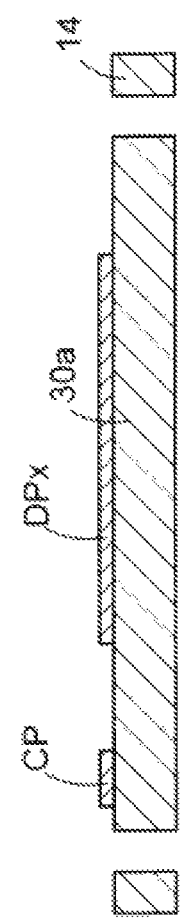

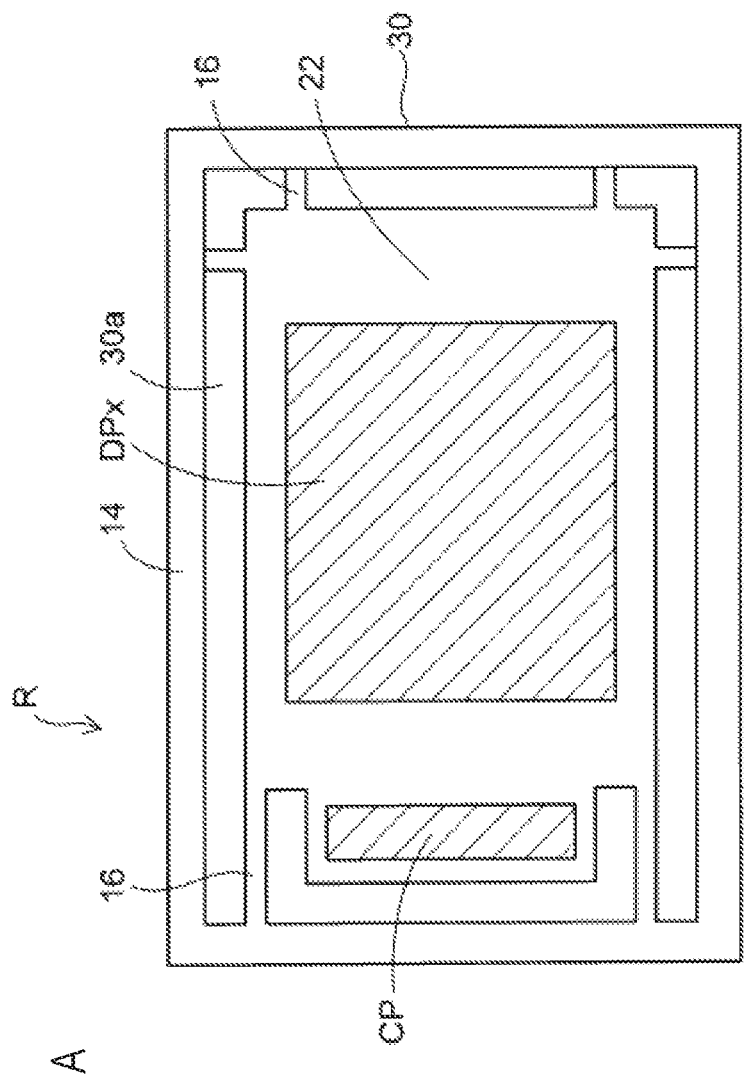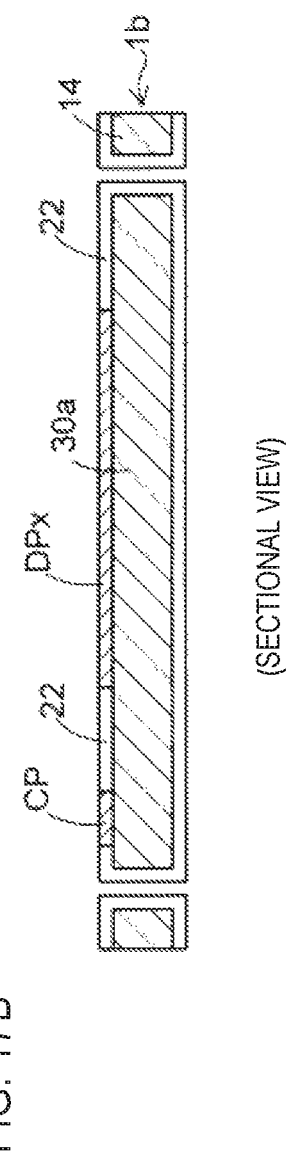
FIG. 17A
FIG. 17B (SECTIONAL VIEW)

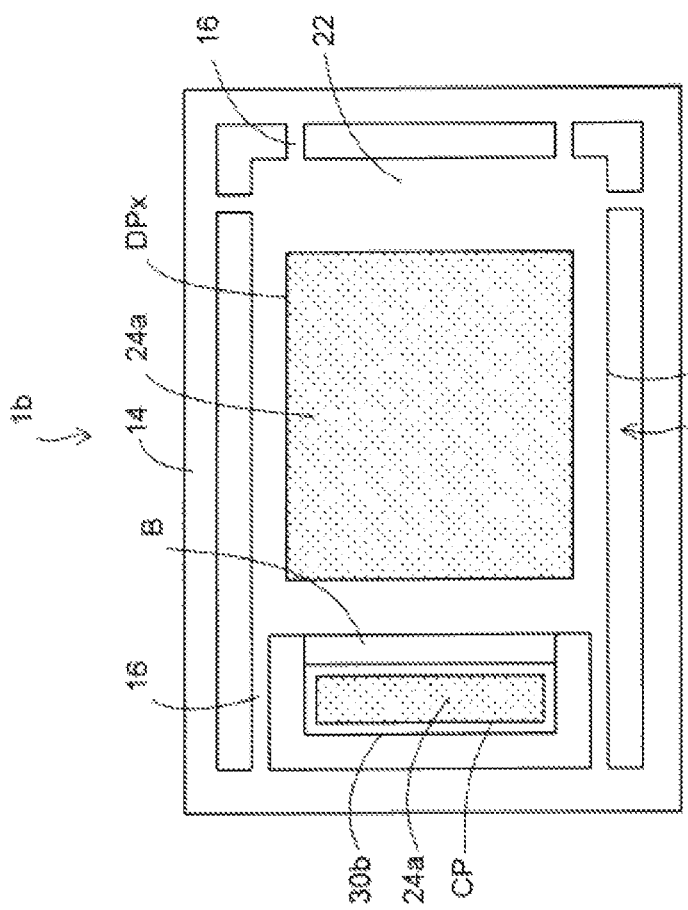
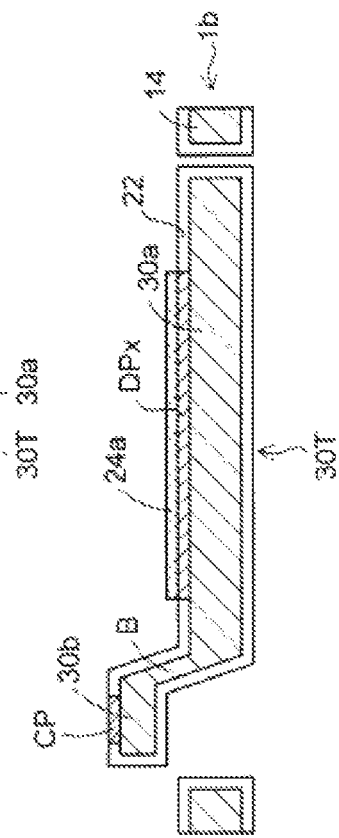
FIG. 19A
FIG. 19B

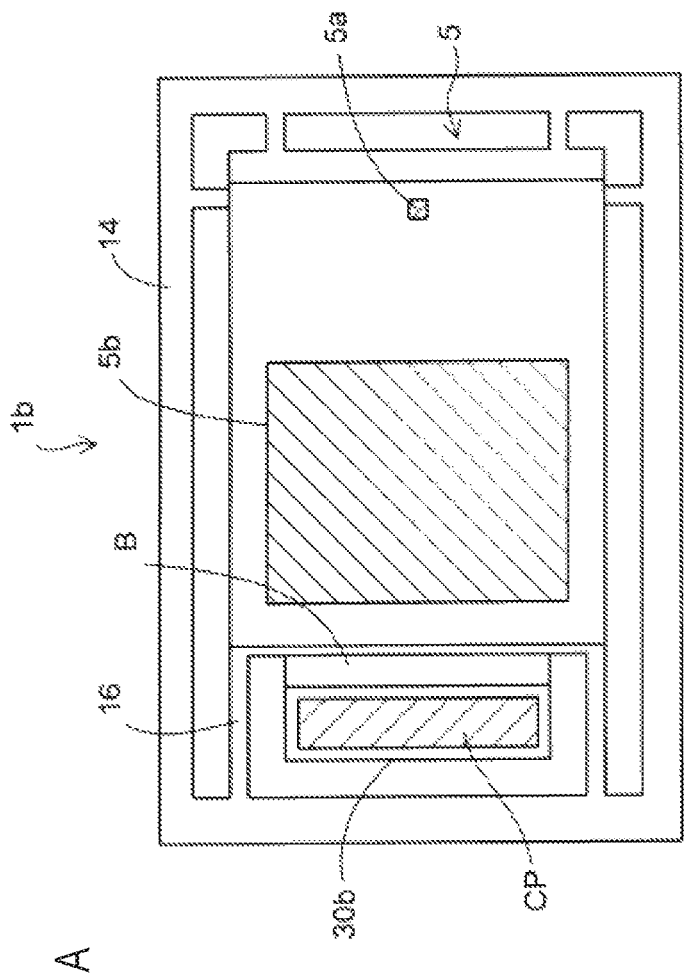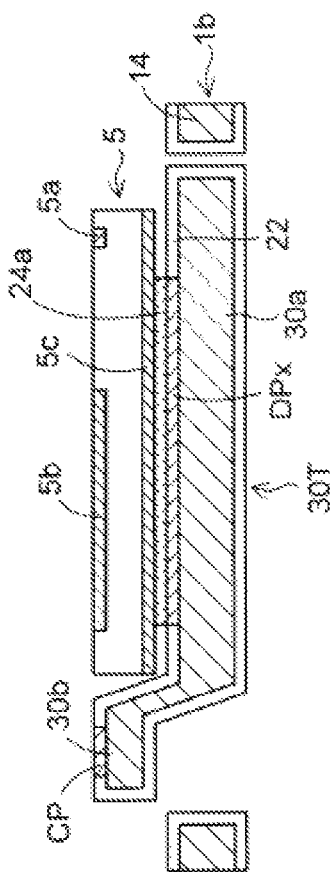
FIG. 22A
FIG. 22B

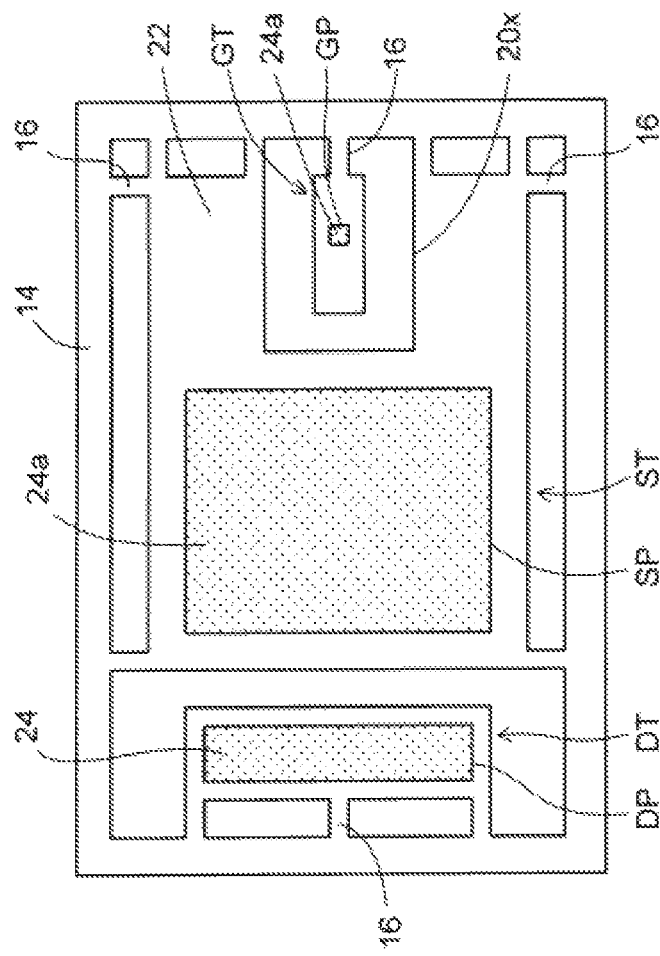
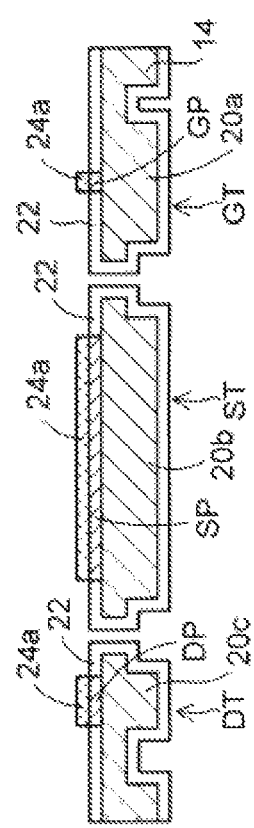
FIG. 23A
FIG. 23B

ELECTRONIC COMPONENT DEVICE

CROSS-REFERENCE TO RELATED APPLICATION

The present application claims priority from Japanese Patent Application No. 2017-133444 filed on Jul. 7, 2017, the entire content of which is incorporated herein by reference.

BACKGROUND

Technical Field

The present disclosure relates to an electronic component device for which a lead frame is used

Related Art

In the related art, an electronic component device in which a power semiconductor chip having a power MOS-FET is packaged using a lead frame has been developed. In the electronic component device, a plurality of solder bumps of the power semiconductor chip is flip chip-connected to a lower lead frame, and a rear surface of the power semiconductor chip is connected to an upper lead frame via a solder.

Patent Document 1: JP-A-2004-332105
Patent Document 2: JP-A-2006-501675

As described later in paragraphs of preliminary matters, in the electronic component device in which the power semiconductor chip is packaged using the lead frame, a terminal part of the power semiconductor chip is connected to a pad part on a copper electrode via the solder.

When reflow heating the solder, a flux contained in the solder flows out to a surrounding of the pad part. Accordingly, the wettability of the solder is secured on the copper electrode around the pad part, as well, and the solder flows out to the surrounding of the pad part.

For this reason, the solder flows outward from the pad part, so that the power semiconductor chip may be tilted or mounted with being positionally misaligned and an electric short or open may be caused in the lead frame.

SUMMARY

Exemplary embodiments of the invention provide an electronic component device having a novel structure capable of preventing a metal joining material from flowing out to a surrounding of a pad part of a lead frame when connecting an electronic component to the pad part via the metal joining material.

An electronic component device according to an exemplary embodiment comprises:
a first lead frame having a first connection terminal, the first connection terminal comprising
 a first metal electrode,
 a first pad part formed on an upper surface of the first metal electrode and formed by a metal plated layer, and
 a first metal oxide layer formed on an upper surface of the first metal electrode in a surrounding region of the first pad part so as to surround an outer periphery of the first pad part; and
an electronic component having a first terminal part provided on its lower surface,
wherein the first terminal part of the electronic component is connected to the first pad part of the first connection terminal via a metal joining material.

A manufacturing method of an electronic component device according to an exemplary embodiment, the manufacturing method comprises:
 patterning a metal plate to form a first metal electrode;
 forming a metal plated layer on an upper surface of the first metal electrode to obtain a first pad part;
 forming a first metal oxide layer on an upper surface of the first metal electrode in a surrounding region of the first pad part to obtain a first lead frame having a first connection terminal comprising the first metal electrode, the first pad part and the first metal oxide layer; and
 connecting a first terminal part provided on a lower surface-side of an electronic component to the first pad part of the first connection terminal via a metal joining material.

According to the present disclosure, in the first connection terminal of the first lead frame of the electronic component device, the first pad part configured by the metal plated layer is formed on the upper surface of the first metal electrode, and the first metal oxide layer is formed on the upper surface of the first metal electrode in the surrounding region of the first pad part.

The first terminal part provided on the lower surface-side of the electronic component is connected to the first pad part of the first connection terminal via the metal joining material.

In one preferable aspect, the metal joining material is formed of a solder containing a flux. The flux has a function of securing the wettability of the solder by removing a natural oxide film on a surface of a metal layer.

When the solder is reflow-heated and thus the flux flows out to a surrounding of the pad part, the flux reduces the first metal oxide layer having a predetermined thickness around the pad part, so that an active force of the flux is decreased.

For this reason, since the wettability of the solder cannot be obtained in the surrounding region of the pad part, the solder is arranged in the pad part. Thereby, the outflow of the solder onto the first metal oxide layer is suppressed. Accordingly, a situation where the electronic component is tilted or mounted with being positionally misaligned and an electric short or open is caused in the lead frame is prevented.

BRIEF DESCRIPTION OF THE DRAWINGS

FIGS. 4A and 4B are a partial plan view and a partial sectional view depicting one lead frame of the exemplary embodiment.

FIGS. 7A to 7C are sectional views and a plan view depicting an aspect of connecting a power semiconductor chip to a pad part of a lead frame of Comparative Example 2 via a solder.

FIG. 8 is a plan view depicting an entire shape of the other lead frame of the exemplary embodiment.

FIGS. 11A and 11B are a partial plan view and a partial sectional view depicting the manufacturing method of one lead frame of the exemplary embodiment (2 thereof).

FIGS. 12A and 12B are a partial plan view and a partial sectional view depicting the manufacturing method of one first lead frame of the exemplary embodiment (3 thereof).

FIGS. 16A and 16B are a partial plan view and a partial sectional view depicting the manufacturing method of the other lead frame of the exemplary embodiment (3 thereof).

FIGS. 17A and 17B are a partial plan view and a partial sectional view depicting the manufacturing method of the other lead frame of the exemplary embodiment (4 thereof).

FIGS. 19A and 19B are a partial plan view and a partial sectional view depicting a manufacturing method of an electronic component device of the exemplary embodiment (1 thereof).

FIGS. 22A and 22B are a partial plan view and a partial sectional view depicting the manufacturing method of the electronic component device of the exemplary embodiment (4 thereof).

FIGS. 23A and 23B are a partial plan view and a partial sectional view depicting the manufacturing method of the electronic component device of the exemplary embodiment (5 thereof).

DETAILED DESCRIPTION

Hereinafter, an exemplary embodiment will be described with reference to the accompanying drawings.

Before describing the exemplary embodiment, preliminary matters, which are bases of the present disclosure, are first described. It should be noted that the preliminary matters include personal investigation contents of the inventors and include technology contents, which are not a known technology.

FIGS. 1A to 2B depict an aspect of connecting a power semiconductor chip to a pad part of a lead frame relating to the preliminary matters via a solder.

Figure 1A:
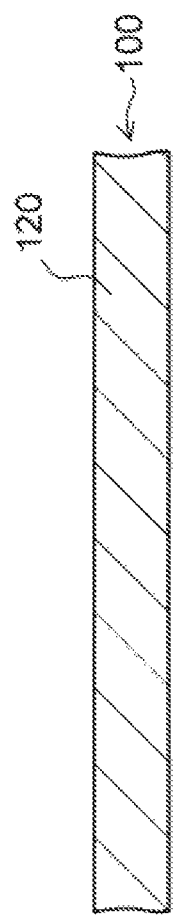
FIGS. 1A and 1B are sectional views depicting an aspect of connecting a power semiconductor chip to a pad part of a lead frame relating to preliminary matters via a solder (1 thereof).

As shown in FIG. 1A, a copper plate is first patterned to prepare a lead frame 100 having a copper electrode 120. The lead frame 100 is demarcated into a plurality of product regions. In FIG. 1A, a part of one product region is shown.

Figure 1B:
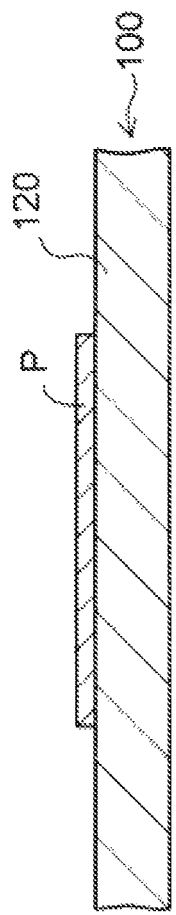

Then, as shown in FIG. 1B, a silver (Ag) plated layer is formed on a connection part of the copper electrode 120, so that a pad part P is obtained. The pad part P has a quadrangular shape, as seen from above, and an area thereof is relatively large, for example, 2 mm×2 mm to 5 mm 5 mm.

Figure 2A:
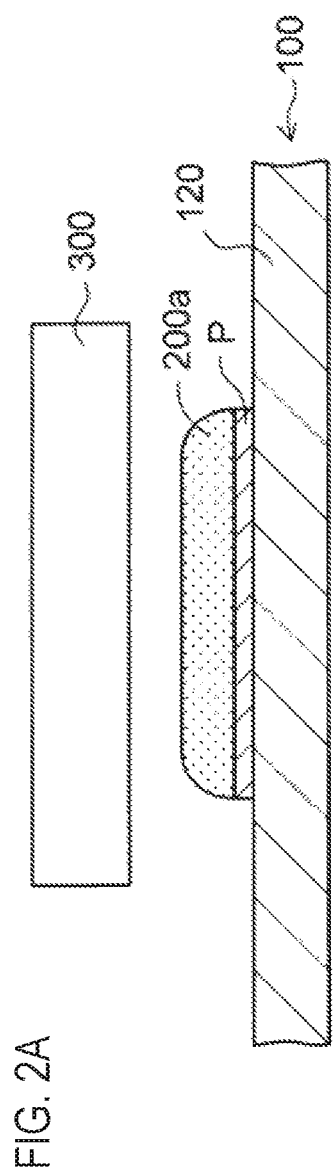
FIGS. 2A and 2B are sectional views depicting the aspect of connecting the power semiconductor chip to the pad part of the lead frame relating to the preliminary matters via the solder (2 thereof).

Then, as shown in FIG. 2A, a solder paste 200a is applied to the pad part P on the copper electrode 120. In the solder paste 200a, a flux is contained in a solder. The flux is contained so as to secure the wettability of the solder to the pad part P. Also, a power semiconductor chip 300 is prepared.

Figure 2B:
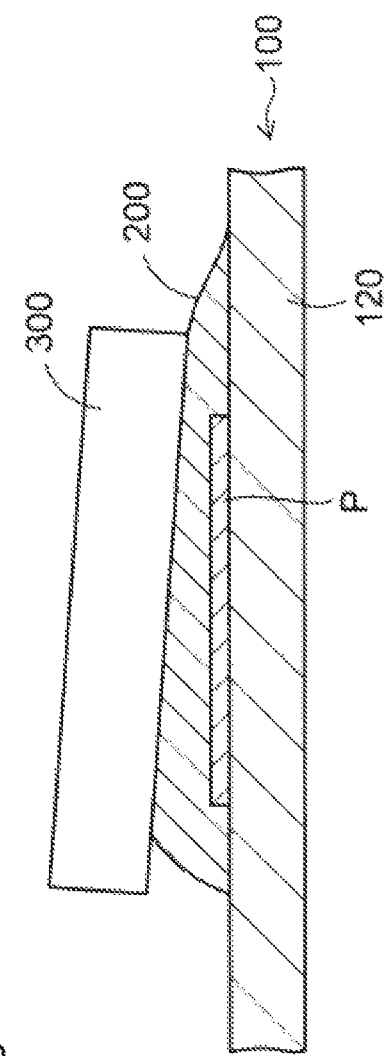

Then, as shown in FIG. 2B, a terminal part (not shown) provided on a lower surface-side of the power semiconductor chip 300 is arranged on the solder paste 200a, and is pressed, which is then reflow-heated.

Thereby, the terminal part of the power semiconductor chip 300 is connected to the pad part P on the copper electrode 120 via a solder 200. At this time, when reflow heating the solder paste 200a, the flux in the solder paste 200a flows out to a surrounding of the pad part P, together with solder particles.

For this reason, a natural oxide film of the copper electrode 120 around the pad part P is removed, so that the wettability of the solder is secured. As a result, the solder 200 flows out onto the copper electrode 120 around the pad part P. When outflow amounts of the solder are different in all directions of the quadrangular pad part P, the power semiconductor chip 300 is tilted or mounted with being positionally misaligned, as shown in FIG. 2B.

Also, the power semiconductor chip 300 is connected to the large-area pad part P of the lead frame 100 with the solder 200 having a sufficient thickness so as to obtain stable electric connection. Accordingly, since a volume of the solder paste 200a to be applied increases, a lateral outflow distance of the solder 200 also increases.

For this reason, an electric short may be caused due to the outflow of the solder 200 between the copper electrodes 120 (the connection terminals) in one product region of the lead frame 100 and between the adjacent product regions. Also, an electric open may be caused due to the positional misalignment of the power semiconductor chip 300.

A lead frame of the exemplary embodiment, which will be described later, can solve the above problems.

Exemplary Embodiment

FIGS. 3 to 9B illustrate a lead frame of the exemplary embodiment, and FIGS. 10A to 18B illustrate a manufacturing method of the lead frame of the exemplary embodiment.

Figure 25:
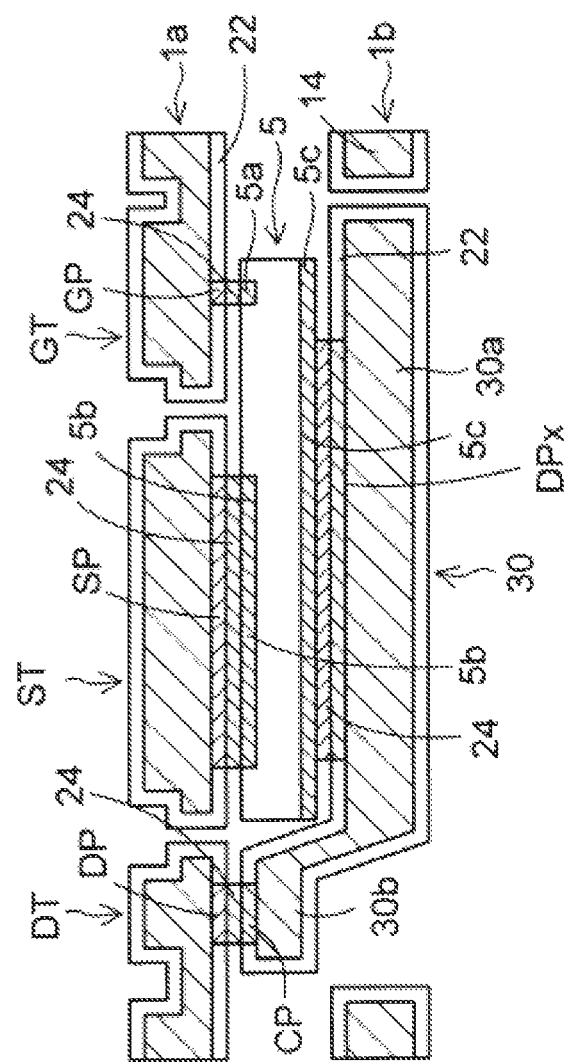
FIG. 25 is a partial sectional view depicting the manufacturing method of the electronic component device of the exemplary embodiment (7 thereof).
Figure 26:
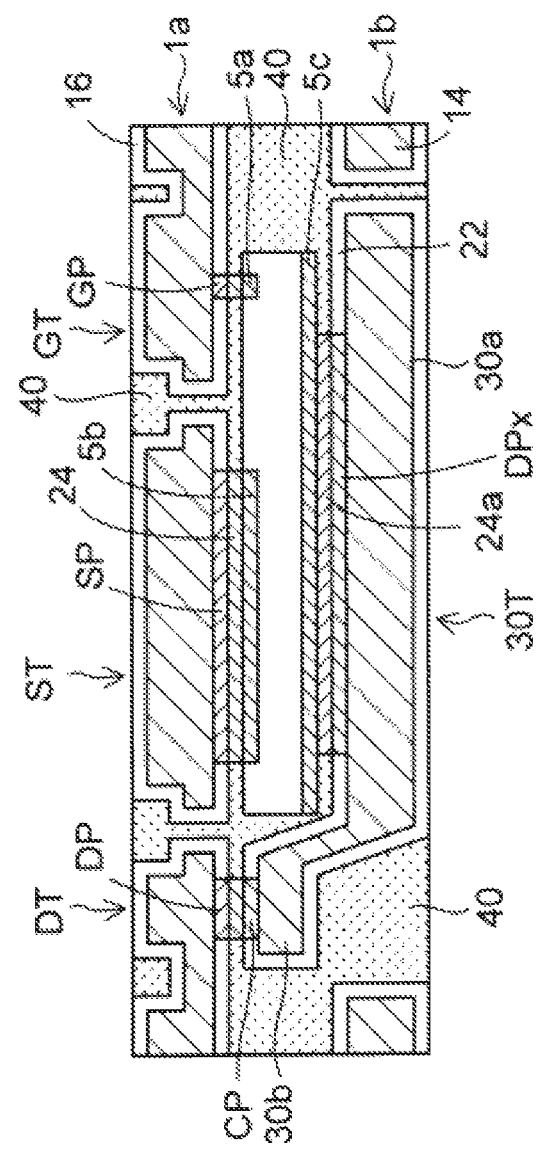
FIG. 26 is a partial sectional view depicting the manufacturing method of the electronic component device of the exemplary embodiment (8 thereof).
Figure 27:
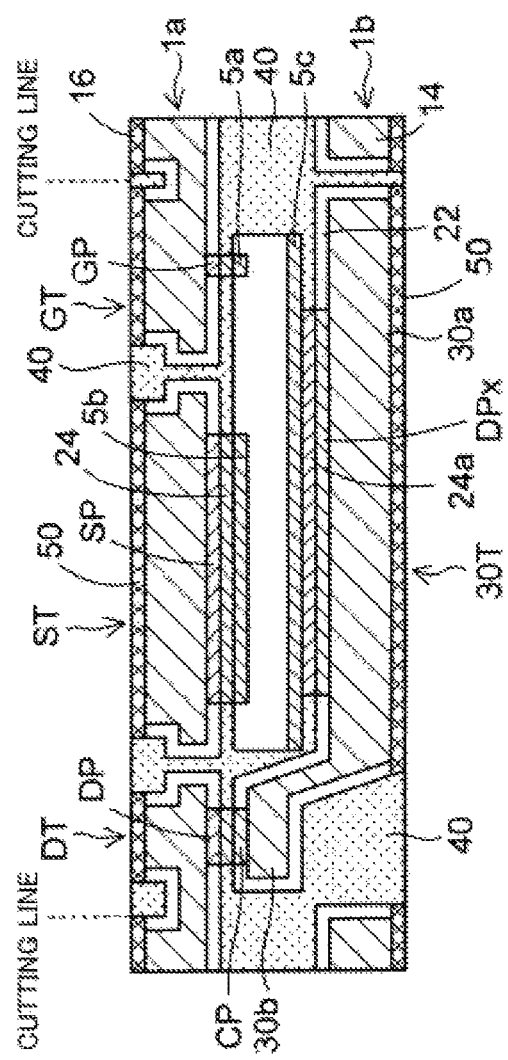
FIG. 27 is a partial sectional view depicting the manufacturing method of the electronic component device of the exemplary embodiment (9 thereof).

Also, FIGS. 19A to 26 illustrate a manufacturing method of an electronic component device of the exemplary embodiment, and FIG. 27 depicts an electronic component device of the exemplary embodiment.

An electronic component device of the exemplary embodiment includes one lead frame and the other lead frame. Hereinafter, one lead frame is denoted with a reference numeral "1a", and the other lead frame is denoted with a reference numeral "1b".

In the descriptions of structures of the lead frame and the electronic component device of the exemplary embodiment, one lead frame 1a is an example of the first lead frame, and the other lead frame 1b is an example of the second lead frame.

Figure 3:
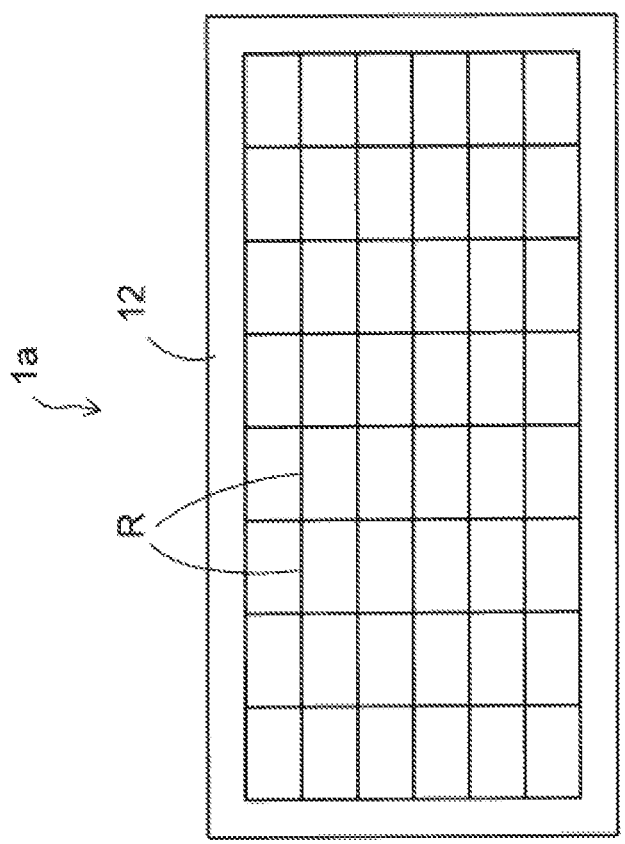
FIG. 3 is a plan view depicting an entire shape of one lead frame of an exemplary embodiment.

One lead frame 1a is first described. FIG. 3 is a plan view depicting an entire form of one lead frame 1a of the exemplary embodiment, as seen from a surface-side.

As shown in FIG. 3, the lead frame 1a has an outer frame part 12 having a rectangular outer shape, and a plurality of product regions R is demarcated at an inner side of the outer frame part 12.

FIG. 4A is a partially enlarged plan view of one product region R of the lead frame 1a shown in FIG. 3. FIG. 4B is a sectional view taken along a line I-I of the plan view of FIG. 4A.

As shown in FIG. 4A, the lead frame 1a has an inner frame part 14 coupled to the outer frame part 12 of the lead frame 1a shown in FIG. 3. A quadrangular region demarcated by the inner frame part 14 is one product region R.

In one end region (a right region) of each product region R in a horizontal direction, a connection terminal GT for gate is arranged. As shown in the sectional view of FIG. 4B, the connection terminal GT for gate is configured by a metal electrode 20a, a pad part GP formed on an upper surface of the metal electrode 20a, and a metal oxide layer 22 formed on an upper surface, side surfaces and a lower surface of the metal electrode 20a in a surrounding region of the pad part GP.

The metal oxide layer 22 is formed to coat an entire outer surface of the metal electrode 20a except the pad part GP. The metal electrode 20a of the connection terminal GT for gate is coupled to the inner frame part 14 by a coupling part 16.

The pad part GP of the connection terminal GT for gate is configured by a metal plated layer. As the metal plated layer, a noble metal plated layer is preferably used, and a silver (Ag) plated layer, a gold (Au) plated layer, a palladium (Pd) plated layer or the like is used.

Also, a connection terminal ST for source is arranged in a central region of each product region R. As shown in the sectional view of FIG. 4B, the connection terminal ST for source is configured by a metal electrode 20b, a pad part SP formed on an upper surface of the metal electrode 20b, and a metal oxide layer 22 formed on an upper surface, side surfaces and a lower surface of the metal electrode 20b in a surrounding region of the pad part SP.

The metal oxide layer 22 is formed to coat an entire outer surface of the metal electrode 20b except the pad part SP. The pad part SP of the connection terminal ST for source is configured by a metal plated layer, like the pad part GP.

The metal electrode 20b of the connection terminal ST for source is coupled to the inner frame part 14 by the coupling part 16.

The metal electrode 20b of the connection terminal ST for source is formed with an opening 20x from a central portion of a right side to an inner region. The connection terminal GT for gate is arranged in the opening 20x of the metal electrode 20b of the connection terminal ST for source.

Also, in the other end region (a left region) of each product region R in the horizontal direction, a connection terminal DT for drain is arranged. As shown in the sectional view of FIG. 4B, the connection terminal DT for drain is configured by a metal electrode 20c, a pad part DP formed on an upper surface of the metal electrode 20c, and a metal oxide layer 22 formed on an upper surface, side surfaces and a lower surface of the metal electrode 20c in a surrounding region of the pad part DP.

The metal oxide layer 22 is formed to coat an entire outer surface of the metal electrode 20c except the pad part DP. The pad part DP of the connection terminal DT for drain is configured by a metal plated layer, like the pad part GP.

The metal electrode 20c of the connection terminal DT for drain is coupled to the inner frame part 14 by the coupling part 16.

Also, the metal oxide layer 22 is formed on outer surfaces of the coupling part 16, the inner frame part 14 and the outer frame part 12 as well.

In this way, the connection terminal GT for gate, the connection terminal ST for source and the connection terminal DT for drain are coupled and supported to the inner frame part 14 by the coupling part 16 with being separated from each other.

The respective metal electrodes 20a, 20b, 20c of the connection terminal GT for gate, the connection terminal ST for source and the connection terminal DT for drain of the lead frame 1a are formed by etching a metal plate from both surfaces so as to penetrate and pattern the metal plate. The metal electrode 20b of the connection terminal ST for source is configured so that a width of a lower part is smaller than a width of an upper part, and a step portion L is formed at an outer periphery of the lower part.

Likewise, a step portion L is formed at an outer periphery of a lower part of the metal electrode 20a of the connection terminal GT for gate. Also, a step portion L is formed at an outer periphery of a lower part of the metal electrode 20c of the connection terminal DT for drain.

Each step portion L functions as an anchor that is to prevent the connection terminal GT for gate, the connection terminal ST for source and the connection terminal DT for drain from falling off from a seal resin when sealing the lead frame 1a with the seal resin.

The coupling part 16 is formed of an upper part of the metal plate, which is left as a result of the half etching of the metal plate from a lower surface-side.

The respective metal oxide layers 22 formed on the connection terminal GT for gate, the connection terminal ST for source, and the connection terminal DT for drain are formed as a result of anodization of the outer surfaces of the metal electrodes 20a, 20b, 20c. For example, each of the metal electrodes 20a, 20b, 20c is a copper electrode, and each of the metal oxide layers 22 is a copper oxide layer ($Cu_2O$ layer).

The metal oxide layer 22 is an oxide layer having acicular crystals. Also, the metal oxide layer 22 has a surface roughness rougher than the surface of the metal plated layer.

Since the metal oxide layer 22 is formed on the entire outer surfaces of the metal electrodes 20a, 20b, 20c except the pad parts GP, SP, DP, it is possible to improve adhesiveness between a seal resin (which will be described later) and the lead frame.

The connection terminal GT for gate, the connection terminal ST for source and the connection terminal DT for drain of the lead frame 1a are examples of the first connection terminal of the first lead frame. Also, the metal electrodes 20a, 20b, 20c of the lead frame 1a are examples of the first metal electrode of the first lead frame.

Figure 5A:
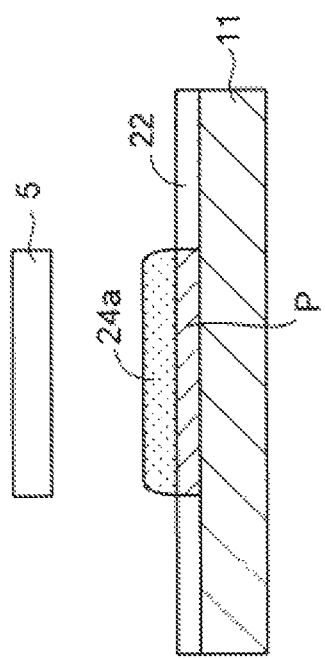
FIGS. 5A to 5C are sectional views and a plan view depicting an aspect of connecting a power semiconductor chip to a pad part of a lead frame of the exemplary embodiment via a solder.
Figure 5B:
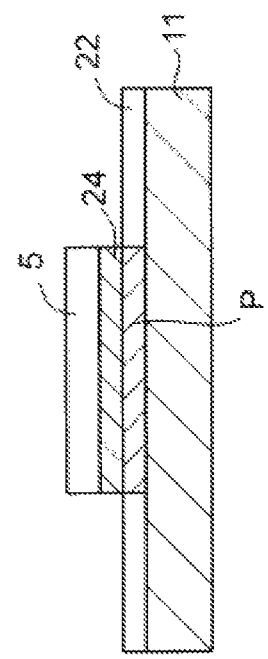
Figure 5C:
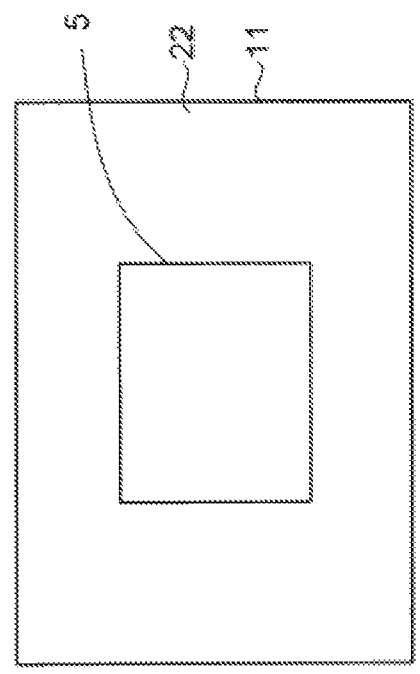

The inventor performed a test so as to check effects of the lead frame 1a of the exemplary embodiment. FIGS. 5A to 5C depict an aspect of connecting a power semiconductor chip to a pad part of a lead frame via a solder.

FIG. 5A to 5C, FIG. 6A, 6B (Comparative Example 1) and FIG. 7A to 7C (Comparative Example 2) depict test results using test samples. The test was performed using a rectangular copper plate replica of the pad part of the lead frame.

As shown in FIG. 5A, a copper electrode 11 formed of a copper plate, as a test sample, was formed thereon with a pad part P formed of a silver plated layer, and the copper electrode 11 in a surrounding region of the pad part P was anodized to form a copper oxide layer 22 ($Cu_2O$ layer). Then, a solder paste 24a containing a flux was applied onto the pad part P. Also, a power semiconductor chip 5 was prepared.

Then, as shown in FIG. 5B, a terminal part (not shown) of the power semiconductor chip 5 was arranged on the solder paste 24a and was pressed, which was then reflow-heated. Thereby, the terminal part of the power semiconductor chip 5 was connected to the pad part P via a solder 24.

At this time, as shown in FIGS. 5B and 5C, the outflow of the solder 24 stopped at an interface between the pad part P and the copper oxide layer 22, so that the solder 24 did not flow out onto the copper oxide layer 22 around the pad part P. FIG. 5C is a plan view of FIG. 5B.

The flux contained in the solder paste 24a has a function of reducing and removing a natural oxide film on a surface of the metal layer so as to secure the wettability of the solder. For this reason, in FIGS. 5B and 5C, when the flux flows out to the surrounding of the pad part P, the copper oxide layer 22 around the pad part P is reduced, so that an active force of the flux is decreased.

As a result, the wettability of the solder cannot be secured and the outflow of the solder does not occur around the pad part P.

In the exemplary embodiment, since the copper oxide layer 22 having a predetermined thickness is formed around the pad part P, the above effect is exhibited. The thickness of the copper oxide layer 22 is set to 0.1 μm to 0.2 μm, for example. For this reason, even though the copper oxide layer 22 is reduced by the flux, the copper oxide layer 22 is left without being completely removed.

In this way, even though the large-volume solder 24 is formed on the large-area pad part P, the solder 24 does not flow to the surrounding of the pad part P. For this reason, it is possible to reliably connect the power semiconductor chip 5 to the lead frame via the solder 24 having the sufficient thickness, without causing the tilting and positional misalignment.

Also, as described later, when establishing an electronic component device by using the lead frame 1a, an electric short, which is caused due to the outflow of the solder between the connection terminals in the product region R and between the adjacent product regions R, is prevented.

Figure 6A:
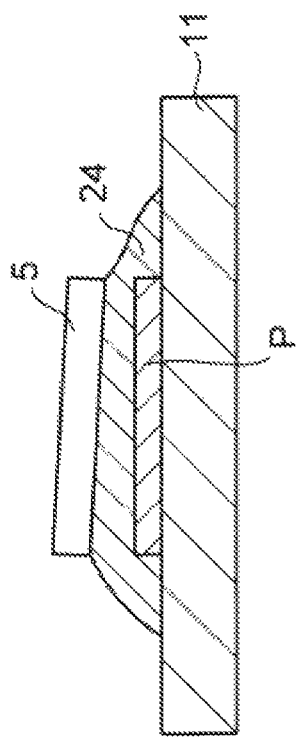
FIGS. 6A and 6B are a sectional view and a plan view depicting an aspect of connecting a power semiconductor chip to a pad part of a lead frame of Comparative Example 1 via a solder.
Figure 6B:
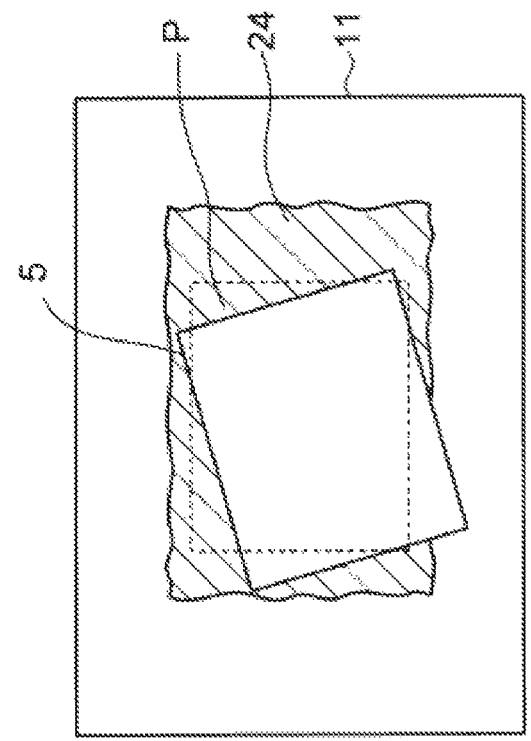

As Comparative Example 1, as shown in FIGS. 6A and 6B, as described above in the preliminary matters, a similar test was performed without the copper oxide layer 22 of FIGS. 5A to 5C.

According to a result of the test, since the surface of the copper electrode 11 is exposed around the pad part P, the active force of the flux is not decreased around the pad part P and the wettability of the solder can be thus secured around the pad part P, too. Accordingly, the solder 24 flows out to the surrounding of the pad part P.

Actually, the natural oxide film is formed on the surface of the copper electrode 11 and the flux reduces and removes the natural oxide film around the pad part P. At this time, however, since the natural oxide film on the copper electrode 11 is extremely thin, the decrease in the active force of the flux is small.

Also, in FIG. 5A, when the surface of the copper electrode 11 is anodized to form the copper oxide layer 22, the copper oxide layer 22 has a roughened surface. For this reason, as Comparative Example 2, a test was performed so as to check whether the outflow of the solder is to stop when the surface of the copper electrode 11 around the pad part P is formed thereon with a copper plated layer, instead of the copper oxide layer 22, so as to roughen the surface.

In Comparative Example 2, as shown in FIG. 7A, a similar test was performed by forming a copper plated layer 23 with an electrolytic plating, instead of the copper oxide layer 22 in FIG. 5A. By adjusting conditions of the electrolytic plating, the copper plated layer 23 was formed to have a roughened surface.

According to a result of the test, even though the copper plated layer 23 having the roughened surface was formed around the pad part P, the activation of the flux was not decreased and the solder 24 flowed to the surrounding of the pad part P in a large amount. The reason is thought that the surface was roughened to accelerate the outflow of the solder 24.

Like this, it could be seen that the phenomenon that the copper oxide layer 22 is formed around the pad part P and the outflow of the solder is thus stopped is a result of the decrease in the activation of the flux due to the copper oxide layer 22, not the roughness of the surface.

Also, in Comparative Example 1 of FIGS. 6A and 6B and Comparative Example 2 of FIGS. 7A to 7C, the outflow of the solder 24 and the tilting and positional misalignment such as rotation of the power semiconductor chip 5 relative to the pad part P are caused. For this reason, the connection reliability of the power semiconductor chip 5 is lowered.

In contrast, in the exemplary embodiment of FIGS. 5A to 5C, the outflow of the solder 24 and the tilting and positional misalignment of the power semiconductor chip 5 are prevented, so that it is possible to improve the connection reliability.

The copper electrode 11 is an example of the metal electrode, and the solder 24 is an example of the metal joining material. Therefore, it is possible to achieve the similar effects by forming a metal oxide layer in a surrounding region of a pad part on a variety of metal electrodes functioning as the connection terminal. Also, it is possible to achieve the similar effects by using a silver paste and the like, as the metal joining material.

Subsequently, the other lead frame 1*b* (the second lead frame) of the exemplary embodiment is described with reference to FIGS. 8 to 9B. FIG. 8 is a plan view depicting an entire form of the other lead frame 1*b* of the exemplary embodiment, as seen from above.

As shown in FIG. 8, like the lead frame 1*a* of FIGS. 3, 4A and 4B, the lead frame 1*b* has an outer frame part 12 having a rectangular outer shape, and a plurality of product regions R is demarcated at an inner side of the outer frame part 12.

Figures 9A, 9B:
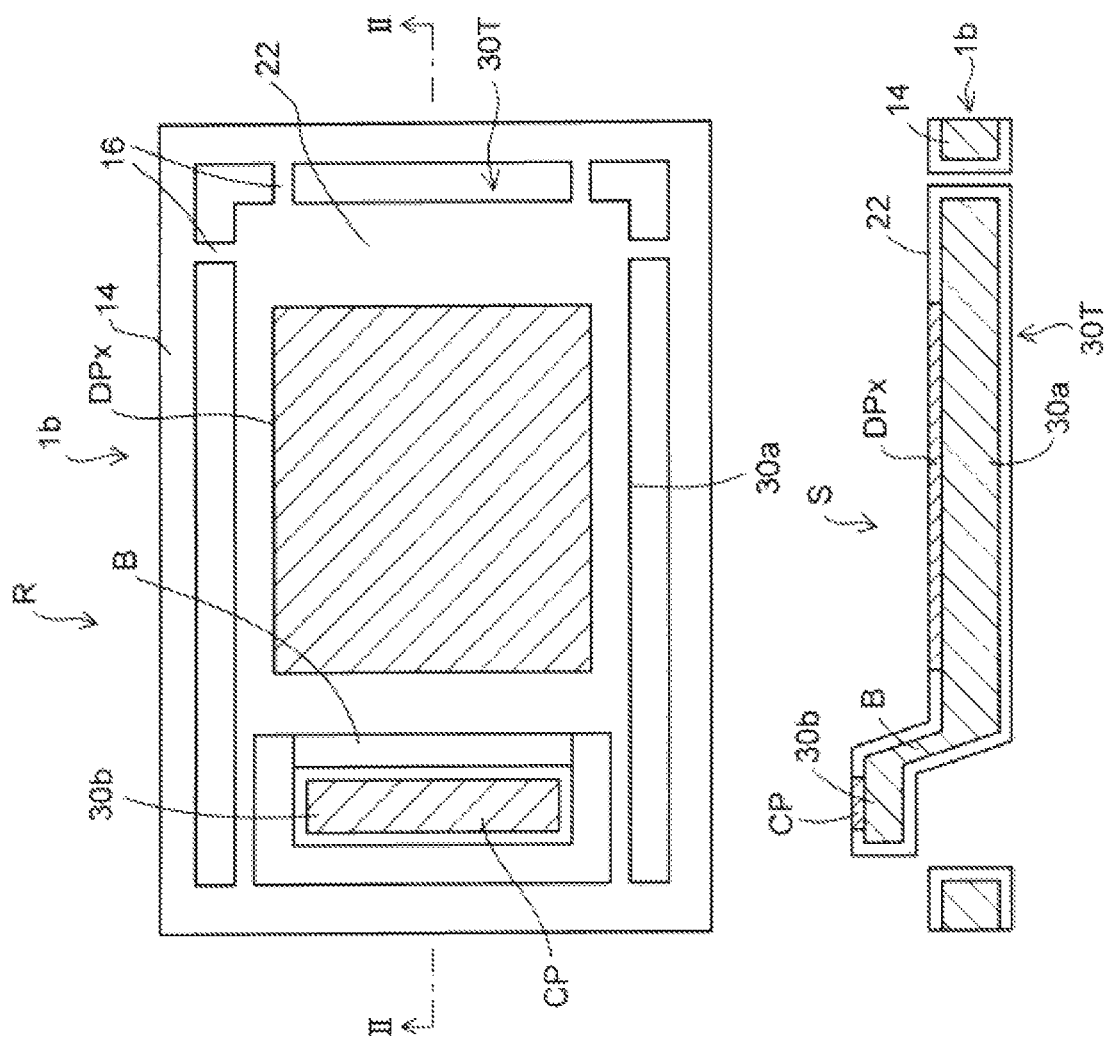
FIGS. 9A and 9B are a partial plan view and a partial sectional view depicting the other lead frame of the exemplary embodiment.

FIG. 9A is a partially enlarged plan view of one product region R of the lead frame 1*b* shown in FIG. 8. FIG. 9B is a sectional view taken along a line II-II of the plan view of FIG. 9A.

As shown in FIG. 9A, the lead frame 1*b* has an inner frame part 14 coupled to the outer frame part 12 of the lead frame 1*b* shown in FIG. 8. A quadrangular region demarcated by the inner frame part 14 is one product region R.

The lead frame 1*b* has a relay connection terminal 30T for drain integrally arranged in a plate shape in a main part of each product region R. The relay connection terminal 30T for drain is an example of the second connection terminal of the second lead frame.

The relay connection terminal 30T for drain has a metal electrode 30*a*, and four corners of the metal electrode 30*a* are coupled to the inner frame part 14 by coupling parts 16.

Referring to the sectional view of FIG. 9B, the metal electrode 30*a* is formed at one end-side in the horizontal direction with a connection part 30*b* coupled to a bent part B bent upward. The connection part 30*b* is arranged at a position higher than the metal electrode 30*a* by the bent part B. An upper surface and a lower surface of the connection part 30*b* are horizontally arranged.

In this way, the relay connection terminal 30T for drain is provided with an accommodation part S in which an electronic component is to be accommodated. The metal electrode 30*a* of the relay connection terminal 30T for drain of the lead frame 1*b* is an example of the second metal electrode of the second lead frame.

Also, a pad part DPx configured by a metal plated layer is formed on the metal electrode 30*a* of the relay connection terminal 30T for drain. Also, a pad part CP is formed on the connection part 30*b* of the metal electrode 30*a*. The pad part CP is configured by a metal plated layer which is the same as that of the pad part DPx.

Also, like the lead frame 1*a* of FIGS. 4A and 4B, a metal oxide layer 22 is formed on an upper surface, side surfaces and a lower surface of the metal electrode 30*a* in each surrounding region of the pad part DPx and the pad part CP.

The metal oxide layer 22 is formed to coat an entire outer surface of the metal electrode 30*a* except the pad part DPx and the pad part CP. Also, the metal oxide layer 22 is formed on outer surfaces of the coupling parts 16, the inner frame part 14 and the outer frame part 12. The metal oxide layer 22 has acicular crystals. A surface roughness of the metal oxide layer 22 is larger than a surface roughness of the metal plated layer.

As described later, when establishing an electronic component device, a drain terminal part of the power semiconductor chip is connected to the pad part DPx of the relay connection terminal 30T for drain of the lead frame 1*b* via a solder.

At this time, like the lead frame 1*a*, since the metal oxide layer 22 is formed around the pad part DPx, the outflow of the solder is suppressed at the outer periphery of the pad part DPx upon the reflow.

Thereby, the positional misalignment and tilting of the power semiconductor chip after the reflow are suppressed.

Also, an electric short due to the solder flowing outward beyond the power semiconductor chip is prevented. Also, it is possible to secure a wide connection area between the power semiconductor chip and the pad part DPx via the solder, so that it is possible to achieve the stable electric connection.

As described later, the connection part 30*b* of the relay connection terminal 30T for drain of the lead frame 1*b* is connected to the connection terminal DT for drain of the lead frame 1*a*. Then, the power semiconductor chip is accommodated in the accommodation part S of the relay connection terminal 30T for drain.

In this way, the relay connection terminal 30T for drain of the lead frame 1*b* sandwiches and packages the power semiconductor chip between the lead frame 1*b* and the lead frame 1*a*.

Subsequently, manufacturing methods of one lead frame 1*a* and the other lead frame 1*b* are described.

Figure 10A:
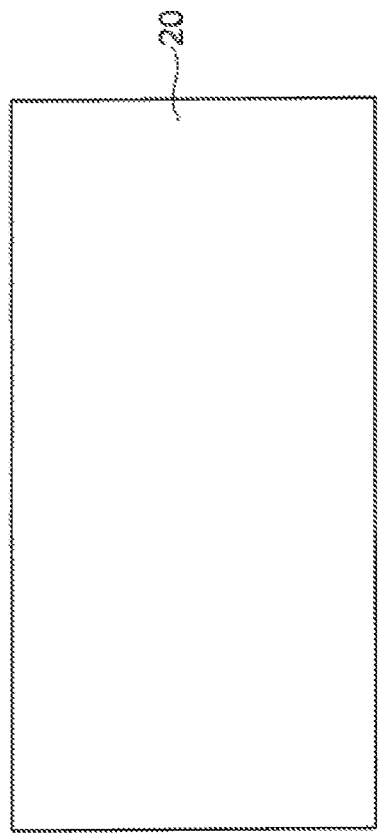
FIGS. 10A and 10B are plan views depicting a manufacturing method of one lead frame of the exemplary embodiment (1 thereof).

First, the manufacturing method of one lead frame 1*a* is described. As shown in FIG. 10A, a metal plate 20 is first prepared. As the metal plate 20, a copper plate is preferably used. The copper plate is formed of pure copper or copper alloy, and has a thickness of 0.1 mm to 0.25 mm.

Figure 10B:
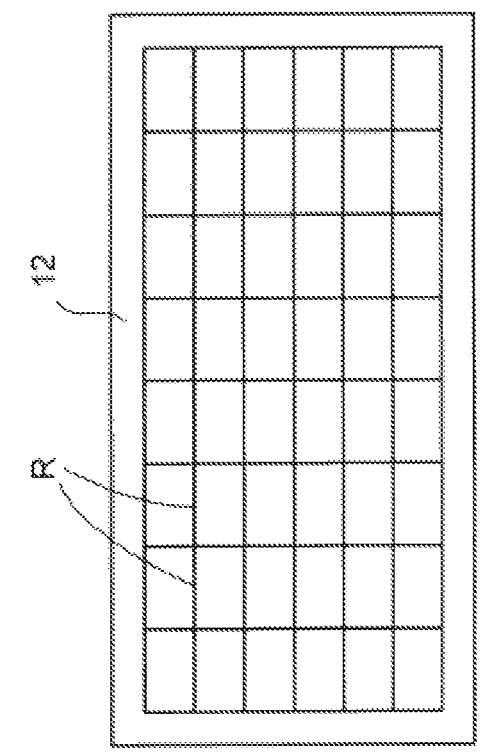

Then, as shown in FIG. 10B, resist layers (not shown) are respectively patterned on both surfaces of the metal plate 20, and the metal plate 20 is wet-etched from both the surfaces.

An etched surface from an upper surface of the metal plate 20 and an etched surface from a lower surface communicate with each other, so that the metal plate 20 is penetrated and patterned. Thereby, the outer frame part 12 is formed, and the plurality of product regions R is demarcated at the inner side of the outer frame part 12.

FIGS. 11A and 11B partially depict one product region R of FIG. 10B. As shown in FIGS. 11A and 11B, the respective metal electrodes 20*a*, 20*b*, 20*c* of the connection terminal GT for gate, the connection terminal ST for source, and the connection terminal DT for drain, which are shown in FIGS. 4A and 4B, are formed with being coupled to the inner frame part 14 by the coupling parts 16.

A size of the resist layer formed on the lower surface of the metal plate 20 is made smaller than a size of the resist layer formed on the upper surface, so that the step portion L is formed at the outer periphery of the lower part of each of the metal electrodes 20*a*, 20*b*, 20*c*.

Then, a plated resist layer (not shown) having openings arranged in regions, which become the respective the pad parts GP, SP, DP of the metal electrodes 20*a*, 20*b*, 20*c* shown in FIGS. 11A and 11B, is formed on the metal plate 20. The lower surface-side of the metal plate 20 is protected by a protection layer (not shown).

Then, a silver plated layer is formed in the openings of the plated resist layer by an electrolytic plating in which the metal plate 20 is used as a power feeding path for plating, and the resist layer is then removed.

Figure 12A:
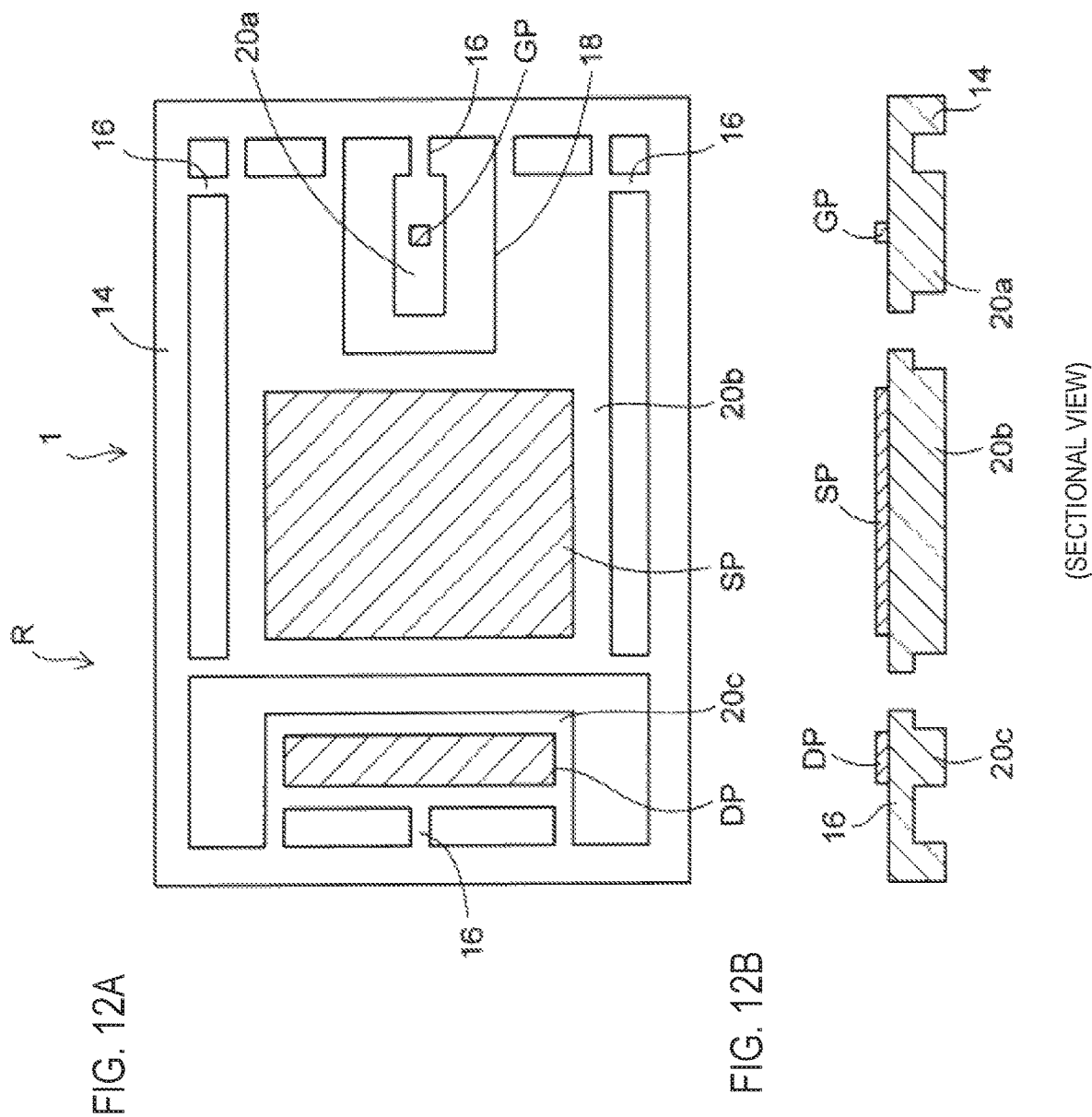

Thereby, as shown in FIGS. 12A and 12B, the pad part GP configured by a silver plated layer is formed on the metal electrode 20*a* becoming the connection terminal GT for gate. At the same time, the pad part SP configured by the silver plated layer is formed at a central portion on the metal electrode 20*b* becoming the connection terminal ST for source.

Also, at the same time, the pad part DP configured by the silver plated layer is formed at a central portion on the metal electrode 20*c* becoming the connection terminal DT for drain.

A thickness of each of the pad parts GP, SP, DP configured by the silver plated layer is 5 μm, for example. The silver plated layer is an example of the noble metal plated layer, and a gold plated layer, a palladium plated layer or the like may also be formed.

Figure 13A:
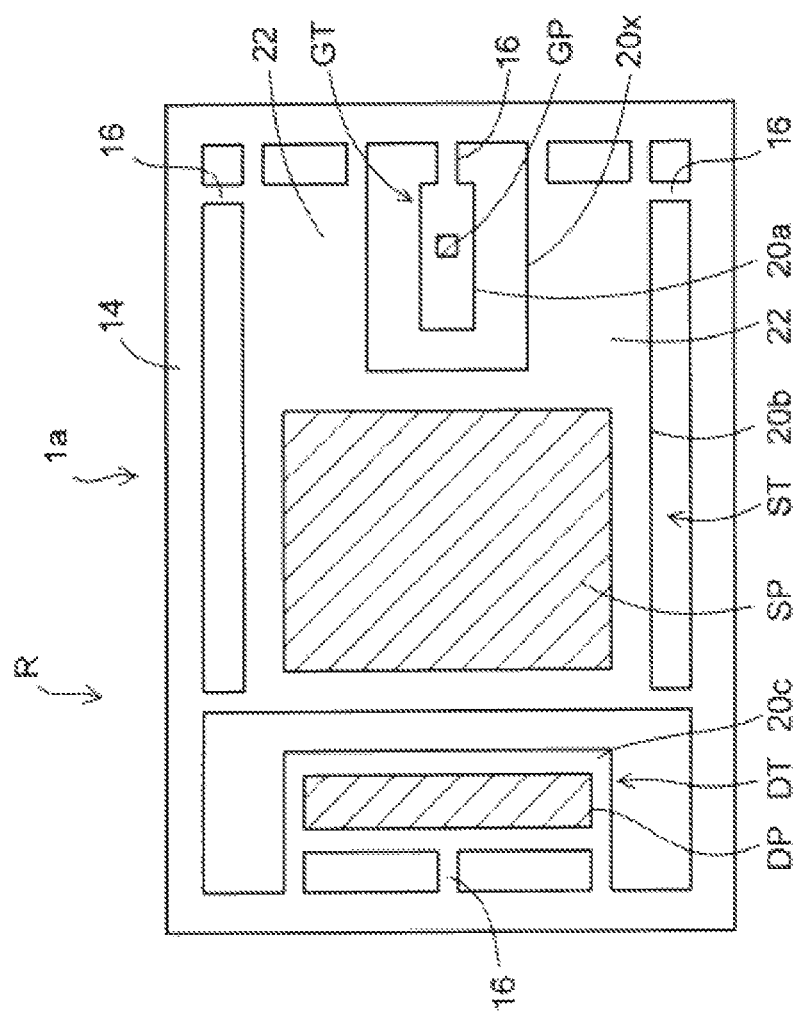
FIGS. 13A and 13B are a partial plan view and a partial sectional view depicting the manufacturing method of one lead frame of the exemplary embodiment (4 thereof).
Figure 13B:
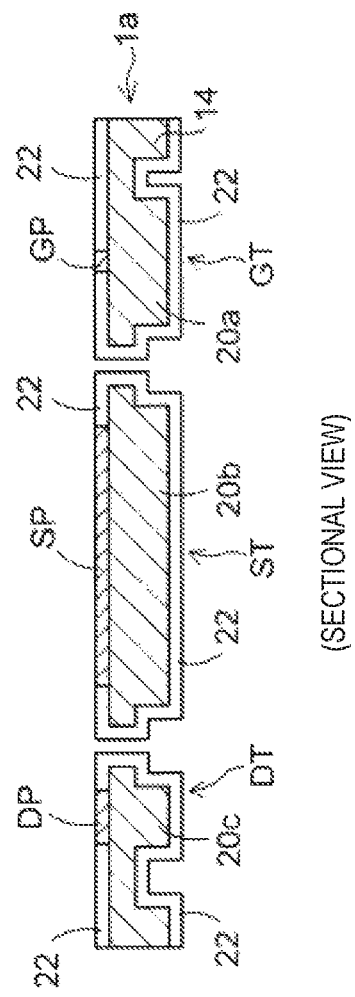

Subsequently, as shown in FIGS. 13A and 13B, an outer surface of the metal plate 20 of the structure shown in FIGS. 12A and 12B is anodized to form the metal oxide layer 22 on the upper surfaces, side surfaces and lower surfaces of the metal electrodes 20a, 20b, 20c in the surrounding regions of the respective pad parts GP, SP, DP.

The anodization is performed by immersing the structure of FIGS. 12A and 12B in an anodizing solution and causing the current to flow by using the metal plate 20 as an anode.

In the case that the metal plate 20 is a copper plate, the anodization is performed on the basis of following treatment conditions.

anodizing solution:
sodium chlorite ($NaClO_2$) 0 to 100 g/L
sodium hydroxide (NaOH) 5 to 60 g/L
trisodium phosphate ($Na_3PO_4$) 0 to 200 g/L
treatment conditions:
bath temperature 50° C. to 80° C.
treatment time 1 second to 20 seconds
current density 0.2 A/dm$^2$ In this way, the metal oxide layer 22 is respectively formed on the upper surfaces, side surfaces and lower surfaces of the metal electrodes 20a, 20b, 20c in the surrounding regions of the respective pad parts GP, SP, DP. Since the pad parts GP, SP, DP are formed of the noble metal plated layer, the pad parts are not anodized. In this way, the metal oxide layer 22 is respectively formed in a self-aligned manner in the surrounding regions of the pad parts GP, SP, DP.

A thickness of the metal oxide layer 22 is 0.1 μm to 0.2 μm. Also, the metal oxide layer 22 is formed to have a roughened surface.

Figure 14A:
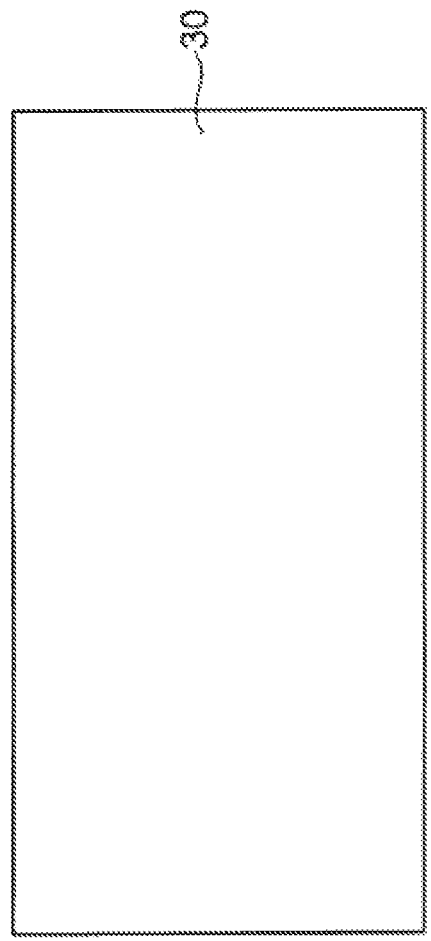
FIGS. 14A and 14B are plan views depicting a manufacturing method of the other lead frame of the exemplary embodiment (1 thereof).

Subsequently, the manufacturing method of the other lead frame 1b is described. As shown in FIG. 14A, a metal plate 30 is first prepared. The metal plate 30 is formed of copper or copper alloy, and has a thickness of 0.1 mm to 0.25 mm. Then, like the manufacturing method of the lead frame 1a, resist layers (not shown) are respectively patterned on both surfaces of the metal plate 30, and the metal plate 30 is wet-etched and penetrated from both the surfaces.

Figure 14B:
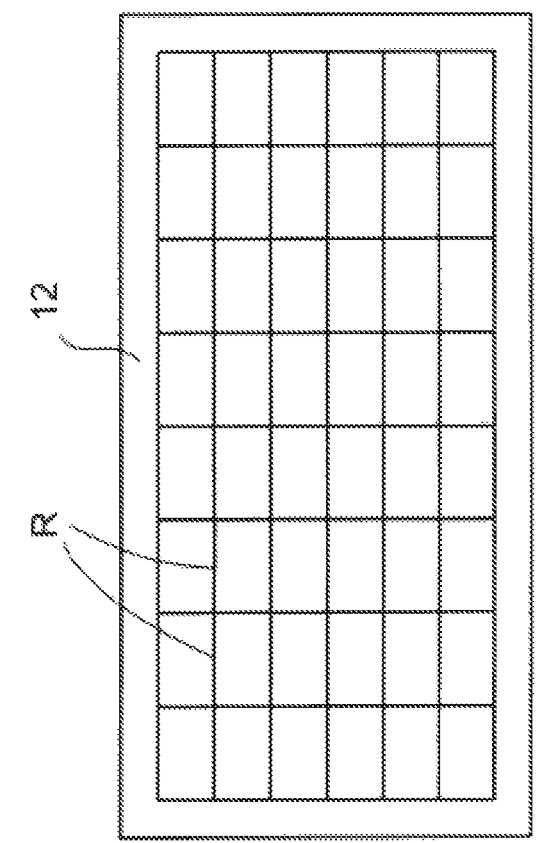

Thereby, as shown in FIG. 14B, the outer frame part 12 is formed and the plurality of product regions R is demarcated at the inner side of the outer frame part 12.

Figure 15A:
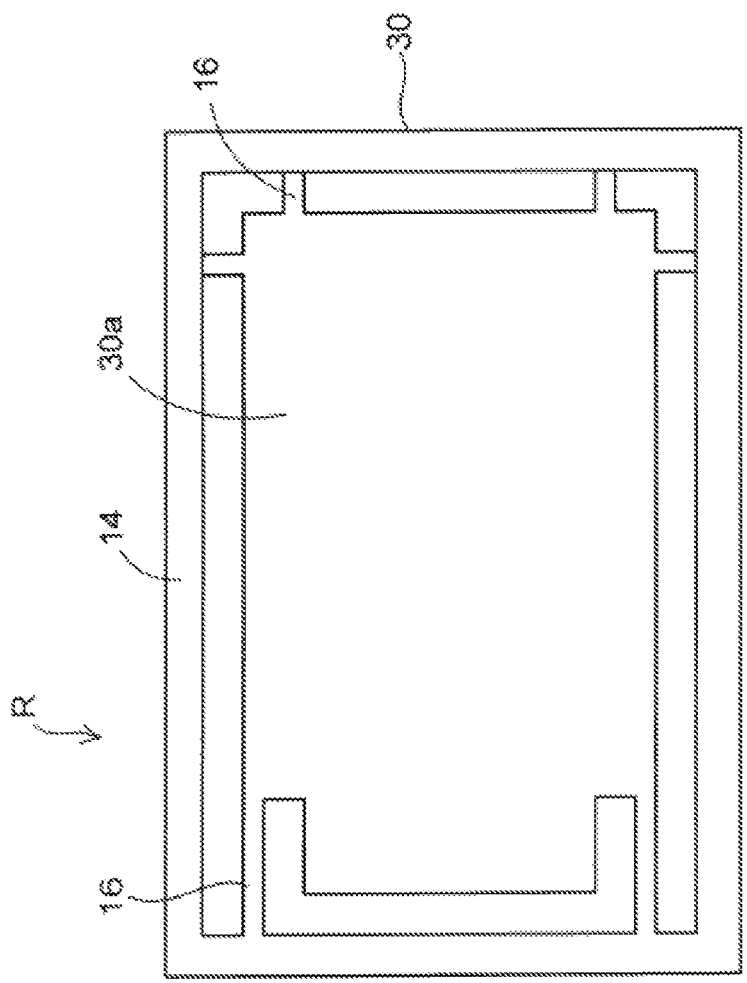
FIGS. 15A and 15B are a partial plan view and a partial sectional view depicting the manufacturing method of the other lead frame of the exemplary embodiment (2 thereof).
Figure 15B:
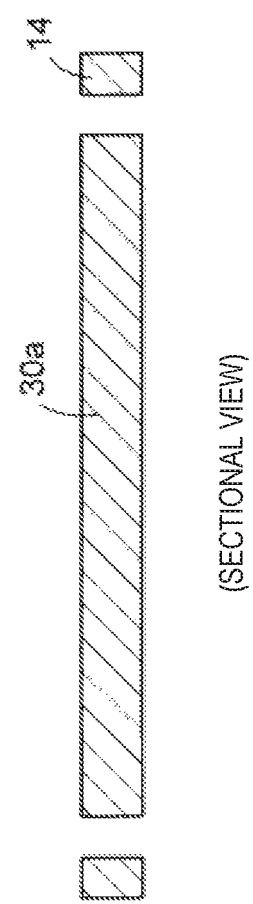

FIGS. 15A and 15B partially depict one product region R of FIG. 14B.

As shown in FIGS. 15A and 15B, the metal electrode 30a for obtaining the relay connection terminal 30T for drain shown in FIGS. 9A and 9B is formed with being coupled to the inner frame part 14 by the coupling parts 16.

Then, as shown in FIGS. 16A and 16B, a silver plated layer is formed to obtain the pad parts DPx, CP by a method similar to the formation method of the pad parts GP, SP, DP of the lead frame 1a shown in FIGS. 12A and 12B. The pad part DPx is arranged at a central portion of the metal electrode 30a, and the pad part CP is arranged in a region becoming a connection part of the metal electrode 30a.

Subsequently, as shown in FIGS. 17A and 17B, the metal oxide layer 22 is formed on the outer surface of the metal electrode 30a except the pad parts DPx, CP by a method similar to the formation method of the metal oxide layer 22 of the lead frame 1a shown in FIGS. 13A and 13B.

Figures 18A, 18B:
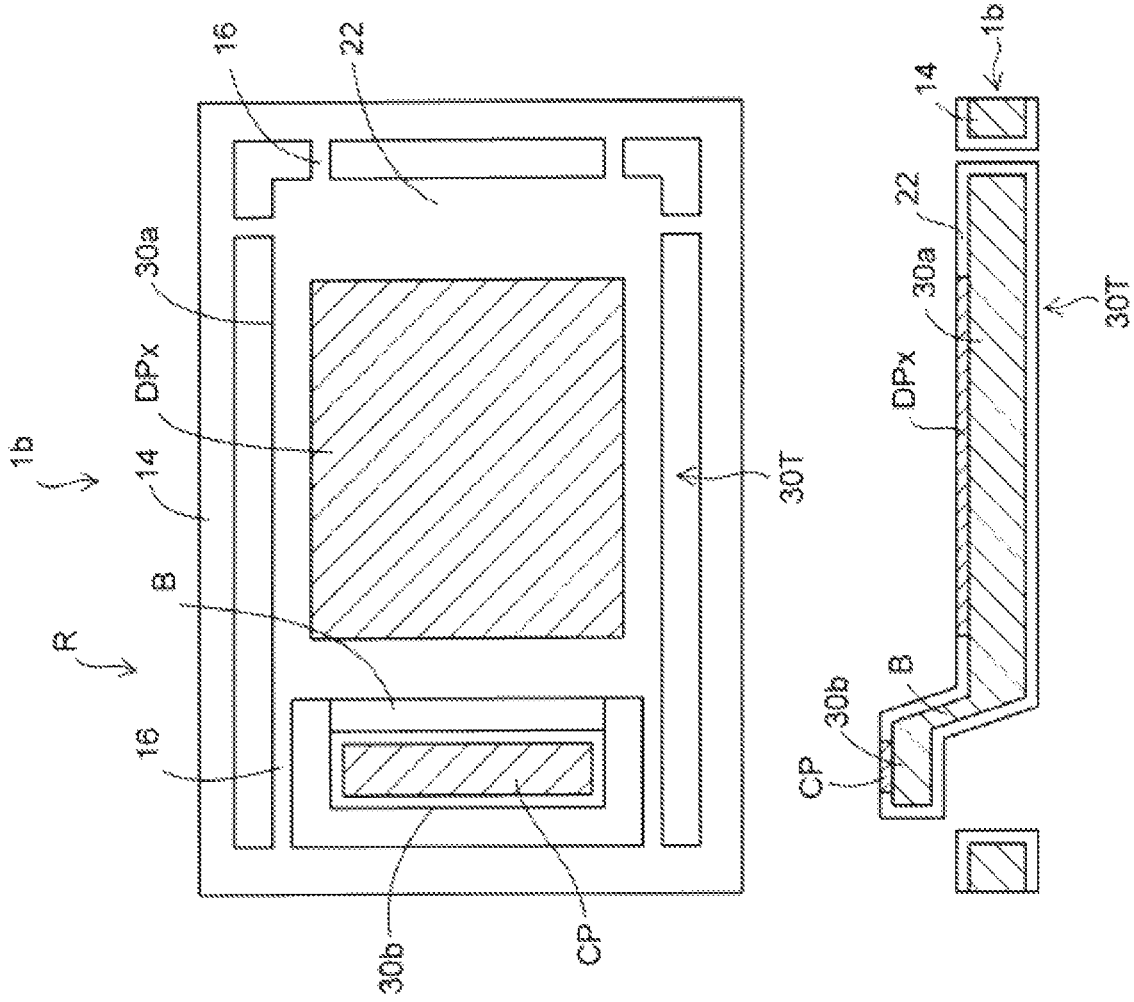
FIGS. 18A and 18B are a partial plan view and a partial sectional view depicting the manufacturing method of the other lead frame of the exemplary embodiment (5 thereof).

Then, as shown in FIGS. 18A and 18B, one end portion of the metal electrode 30a having a flat plate shape is bent by press working, so that the connection part 30b coupled to the bent part B bent upward is formed. Thereby, the metal electrode 30a having the connection part 30b shown in FIGS. 9A and 9B is obtained.

In this way, the other lead frame 1b shown in FIGS. 9A and 9B is obtained.

The process of obtaining one lead frame 1a includes obtaining the other lead frame 1b, and one lead frame 1a and the other lead frame 1b may be manufactured in parallel.

Subsequently, a method of manufacturing an electronic component device by using one lead frame 1a and the other lead frame 1b is described. In an example of the manufacturing method of the electronic component device, the other lead frame 1b is adopted as the first lead frame, and one lead frame 1a is adopted as the second lead frame.

As shown in FIGS. 19A and 19B, the other lead frame 1b shown in FIGS. 9A and 9B is first prepared as the first lead frame, and the solder paste 24a is applied onto the pad part DPx of the relay connection terminal 30T for drain.

The solder paste 24a is formed by a dispenser, a screen printing or the like. In the solder paste 24a, the solder contains the flux.

As the solder paste 24a, a high melting point solder is used. For example, a solder of 95 wt % lead (Pb)/5% tin (Sn) is used. Also, a variety of solders such as Pb-free solder, fluxless solder and the like can be used.

The solder paste 24a is an example of the metal joining material, and a silver paste or the like can also be used.

Figure 20A:
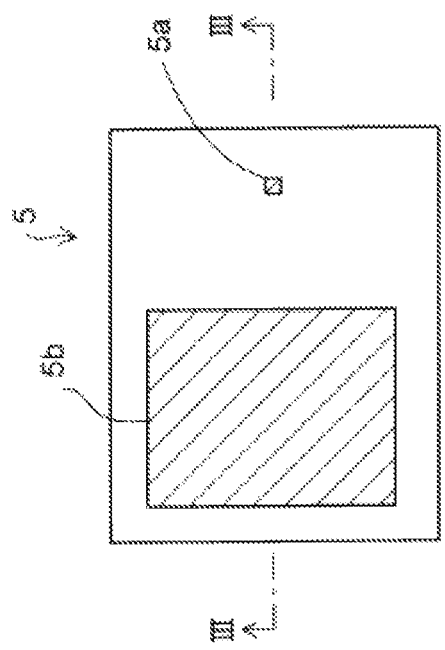
FIGS. 20A to 20C are plan views and a sectional view depicting the manufacturing method of the electronic component device of the exemplary embodiment (2 thereof).
Figure 20B:
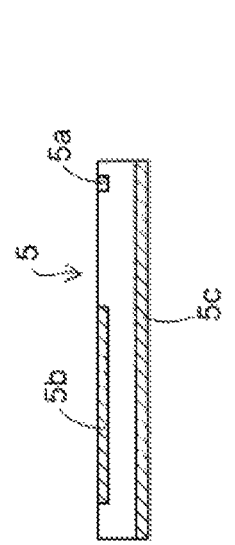
Figure 20C:
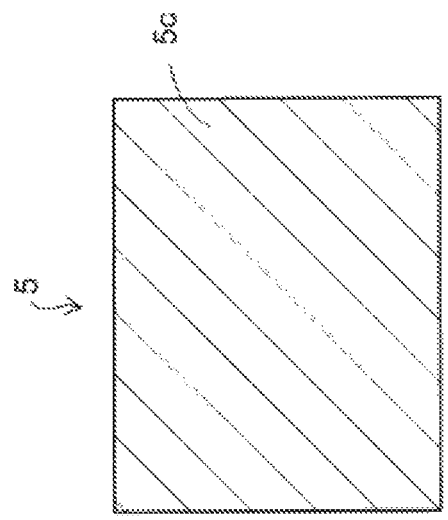

Also, as shown in FIGS. 20A and 20B, the power semiconductor chip 5 having a power MOSFET is prepared. FIG. 20B is a sectional view taken along a line III-III of FIG. 20A. Also, FIG. 20C is a plan view of FIG. 20A, as seen from a backside.

The power semiconductor chip 5 has a gate terminal part 5a connected to a gate electrode and a source terminal part 5b connected to a source electrode on one surface, and has a drain terminal part 5c connected to a drain electrode on the other surface. As shown in FIG. 20C, the drain terminal part 5c is arranged on the other entire surface of the power semiconductor chip 5.

The power semiconductor chip is an example of the electronic component, and a variety of electronic components that can be connected to the pad part of the lead frame via the solder can be used.

Figure 21:
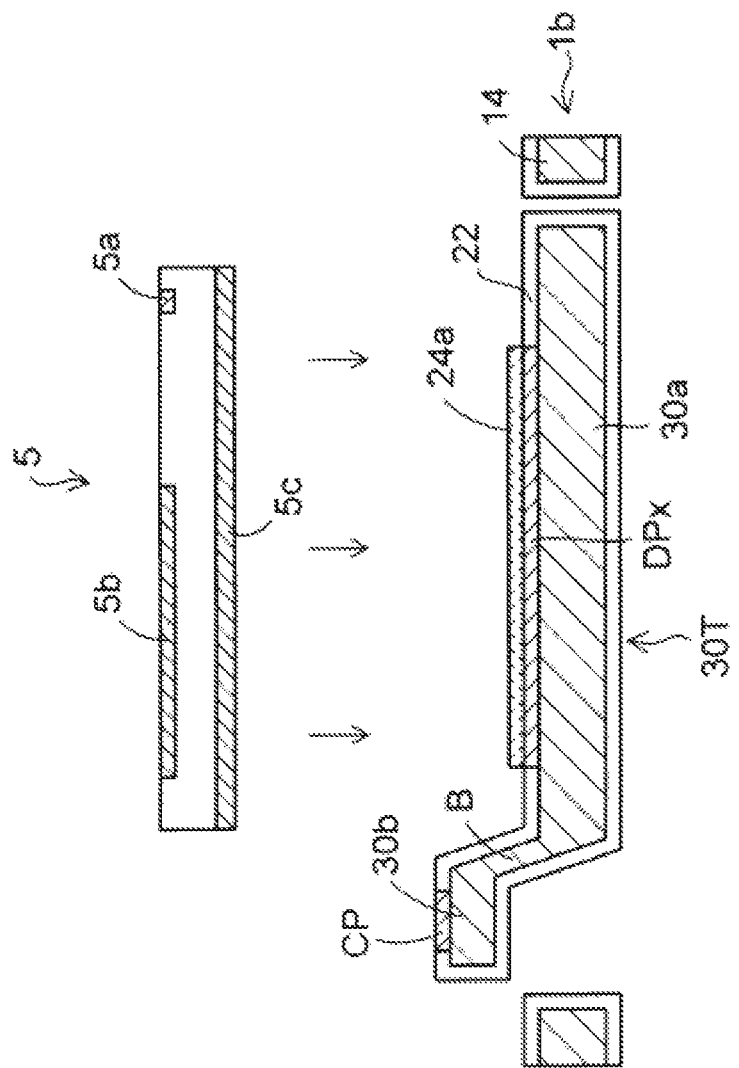
FIG. 21 is a partial sectional view depicting the manufacturing method of the electronic component device of the exemplary embodiment (3 thereof).

As shown in FIG. 21, the drain terminal part 5c of the power semiconductor chip 5 of FIG. 20 is arranged with being positionally aligned with the solder paste 24a on the pad part DPx of the relay connection terminal 30T for drain shown in FIG. 19B.

Thereby, as shown in FIGS. 22A and 22B, the drain terminal part 5c of the power semiconductor chip 5 is temporarily bonded to the solder paste 24a on the pad part DPx of the relay connection terminal 30T for drain. In this stage, the solder paste 24a is in a non-cured state in which the solder paste 24a is not subjected to the reflow heating.

Then, as shown in FIGS. 23A and 23B, the lead frame 1a of FIGS. 4A and 4B is prepared as the second lead frame, and the solder paste 24a is applied onto the respective pad parts GP, SP, DP.

At this time, since the size of the pad part GP of the connection terminal GT for gate is small, the solder paste 24a is preferably applied by the screen printing.

Figure 24:
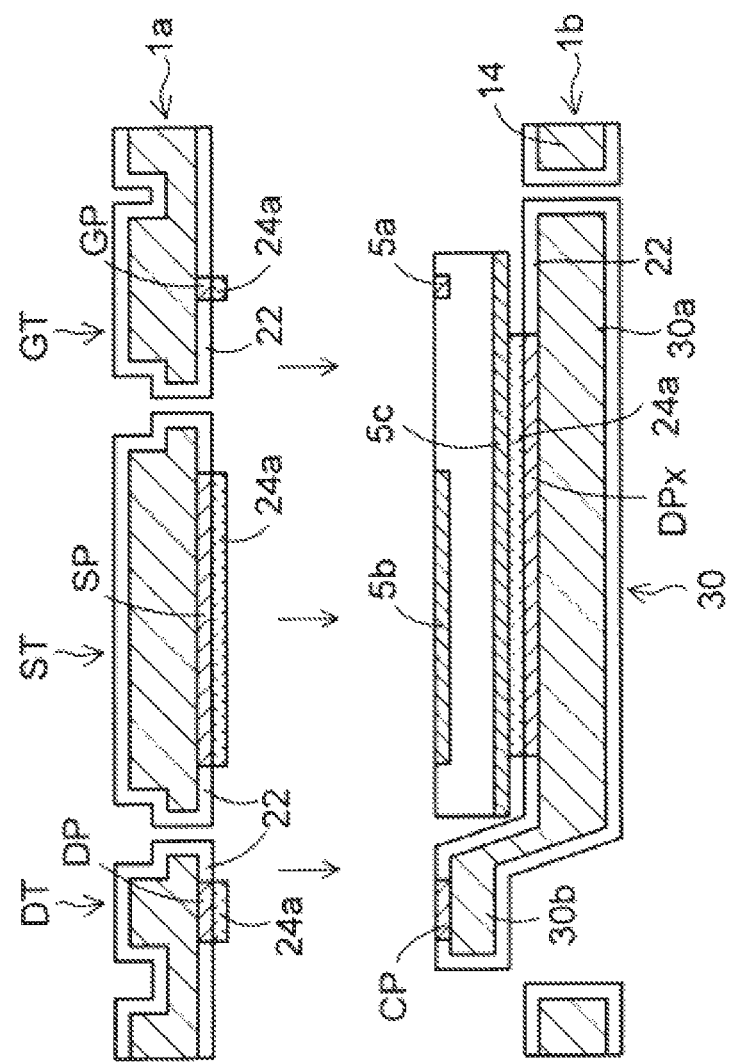
FIG. 24 is a partial sectional view depicting the manufacturing method of the electronic component device of the exemplary embodiment (6 thereof).

Also, as shown in FIG. 24, the lead frame 1a of FIG. 23B is inverted upside down. Then, the surface of the lead frame 1a of FIG. 23B, on which the solder paste 24a is formed, is arranged with facing the power semiconductor chip 5 of the structure of FIG. 22B.

At this time, the pad part GP of the connection terminal GT for gate of the lead frame 1a is arranged with being positionally aligned with the gate terminal part 5a of the power semiconductor chip 5. At the same time, the pad part SP of the connection terminal ST for source of the lead frame 1a is arranged with being positionally aligned with the source terminal part 5b of the power semiconductor chip 5.

Also, at the same time, the pad part DP of the connection terminal DT for drain of the lead frame 1a is arranged with being positionally aligned with the pad part CP of the connection part 30b of the relay connection terminal 30T for drain of the lead frame 1b.

In this way, as shown in FIG. 25, the power semiconductor chip 5 is sandwiched and pressed between the lead frame 1a and the lead frame 1b and is reflow-heated. Thereafter, flux cleaning is performed.

Thereby, the pad part GP of the connection terminal GT for gate of the lead frame 1a is connected to the gate terminal part 5a of the power semiconductor chip 5 via the solder 24. At the same time, the pad part SP of the connection terminal ST for source of the lead frame 1a is connected to the source terminal part 5b of the power semiconductor chip 5 via the solder 24.

Also, at the same time, the pad part DP of the connection terminal DT for drain of the lead frame 1a is connected to the pad part CP of the connection part 30b of the relay connection terminal 30T for drain of the lead frame 1b via the solder 24.

Also, at the same time, the pad part DPx of the relay connection terminal 30T for drain of the lead frame 1b is connected to the drain terminal part 5c of the power semiconductor chip 5 via the solder 24.

As described above, the metal oxide layer 22 is formed in the surrounding regions of the respective pad parts GP, SP, DP of the lead frame 1a.

For this reason, by the above-described principle, the outflow of the solder 24 is suppressed at the outer periphery of each of the pad parts GP, SP, DP of the lead frame 1a, so that the outflow of the solder 24 to the surrounding regions is suppressed. In this way, the solder 24 does not flow out onto the metal oxide layer 22, and the metal oxide layer 22 is in a state in which it is exposed from the solder 24.

Thereby, the electric short due to the solder 24 is prevented between the connection terminal GT for gate and the connection terminal ST for source in each product region R of the lead frame 1a. Also, the electric short is prevented between the connection terminal ST for source and the connection terminal DT for drain in each product region R of the lead frame 1a.

Also, there is no concern that the electric short is to occur due to the outflow of the solder 24 between the adjacent product regions R of the lead frame 1a. Accordingly, it is possible to implement a high-density layout of the plurality of product regions R of the lead frame 1a, and to improve a degree of design freedom.

Also, in each product region R of the lead frame 1a, the non-uniformity in the thickness of the solder 24 and the inclination of the power semiconductor chip 5 is improved. For this reason, the characteristic variation of the electric connection of the plurality of power semiconductor chips 5 in the lead frame 1a is decreased, and the reliability of a temperature cycle test can be improved.

Also, since the outflow of the solder 24 is suppressed, the tilting and positional misalignment of the power semiconductor chip 5 are prevented. Thereby, the electric short or open in the electronic component device is prevented.

For example, a size of the gate terminal part 5a of the power semiconductor chip 5 is about 200 μm×200 μm to 300 μm×300 μm. Also, the pad part GP of the connection terminal GT for gate of the lead frame 1a, which corresponds to the gate terminal part 5a, is small.

Accordingly, when the slight tilting or positional misalignment such as rotation of the power semiconductor chip 5 is caused due to the outflow of the solder 24, the electric open occurs between the gate terminal part 5a of the power semiconductor chip 5 and the pad part GP of the connection terminal GT for gate of the lead frame 1a.

Also, the connection terminal GT for gate, the connection terminal ST for source and the connection terminal DT for drain of the lead frame 1a are arranged closely to each other. Therefore, the electric short occurs among the connection terminals GT, ST, DT, in association with the slight outflow of the solder 24.

In the exemplary embodiment, since the outflow of the solder 24 is suppressed, the above problems can be solved.

Also, since the metal oxide layer 22 is formed in the surrounding region of the pad part DPx of the relay connection terminal 30T for drain of the lead frame 1b, the outflow of the solder 24 is suppressed at the outer periphery of the pad part DPx, so that the outflow of the solder 24 to the surrounding region is suppressed.

Thereby, during the manufacturing process, the short of the power semiconductor chips 5 between the adjacent product regions R which is caused due to the solder 24, is prevented.

The process of connecting the power semiconductor chip 5 to the pad part DPx of the relay connection terminal 30T for drain of the lead frame 1b includes connecting the respective pad parts GP, SP, DP of the lead frame 1a to the power semiconductor chip 5.

Contrary to the above manufacturing method, one lead frame 1a may be adopted as the first lead frame, and the other lead frame 1b may be adopted as the second lead frame.

In this case, after the power semiconductor chip 5 is arranged on the connection terminals GT, ST, DT of one lead frame 1a, the relay connection terminal 30T for drain of the other lead frame 1b is arranged on the power semiconductor chip 5. In this aspect, the structure of FIG. 25 is inverted upside down, so that a similar connection structure is obtained.

Also, in the example of the above manufacturing method, the reflow heating is performed with the power semiconductor chip 5 being sandwiched between one lead frame 1a and the other lead frame 1b, so that the solder connections at the upper and lower sides are performed at the same time.

In addition to the above manufacturing method, after connecting the power semiconductor chip 5 to one lead frame 1a via the solder 24 by the reflow heating, the other lead frame 1b may be connected onto the power semiconductor chip 5 via the solder 24.

Also, on the contrary, after connecting the power semiconductor chip 5 to the other lead frame 1b via the solder 24 by the reflow heating, one lead frame 1a may be connected onto the power semiconductor chip 5 via the solder 24 by the reflow heating.

Continuously, as shown in FIG. 26, a seal resin (encapsulation resin) 40 is filled in a gap between the lead frame 1a and the lead frame 1b. The seal resin 40 is formed by a transfer mold method.

The structure of FIG. 25 is sandwiched between a lower mold and an upper mold of a metallic mold, and resin is injected from an injection port arranged in a horizontal direction, so that the seal resin 40 is formed. As a preferable example of the seal resin 40, epoxy resin is used.

The seal resin 40 is formed between the lead frame 1a and the power semiconductor chip 5 and between the lead frame 1b and the power semiconductor chip 5 so as to embed the entire power semiconductor chip 5.

Also, the seal resin 40 is formed to embed a region between the connection terminal GT for gate and the connection terminal ST for source of the lead frame 1a, a region between the connection terminal ST for source and the connection terminal DT for drain, and a half etched part of the coupling part 16 on the backside.

Also, the seal resin 40 is formed to embed a region between the relay connection terminals 30T for drain of the lead frame 1b and a space of the outer surface-side of the connection part 30b.

Also, the respective outer surfaces (outer connection surfaces) of the connection terminal GT for gate, the connection terminal ST for source and the connection terminal DT for drain of the lead frame 1a are exposed from the seal resin 40. Also, the outer surface of the relay connection terminal 30T for drain of the lead frame 1b is exposed from the seal resin 40.

In this way, the lead frames 1a, 1b are exposed from the seal resin 40, so that the radiation performance of heat to be generated from the power semiconductor chip 5 can be improved.

Subsequently, as shown in FIG. 27, the metal oxide layers 22 of the connection terminal GT for gate, the connection terminal ST for source, the connection terminal DT for drain, and the relay connection terminal 30T for drain exposed from the seal resin 40 are removed by pre-treatment of plating. As the pre-treatment of the plating, acidic or alkali treatment is performed.

Continuously, the plating is performed by the electrolytic plating, so that the surfaces of the connection terminal GT for gate, the connection terminal ST for source, the connection terminal DT for drain, and the relay connection terminal 30T for drain exposed from the seal resin 40 are formed with plating layers 50.

As the plating, tin (Sn) 100% plating, tin (Sn)/bismuth (Bi) plating or tin (Sn)/silver (Ag) plating is performed.

Thereafter, each product region R is cut from the lead frame 1a to the lead frame 1b, so that the coupling parts 16, the inner frame part 14 and the outer frame part 12 are separated.

Figure 28:
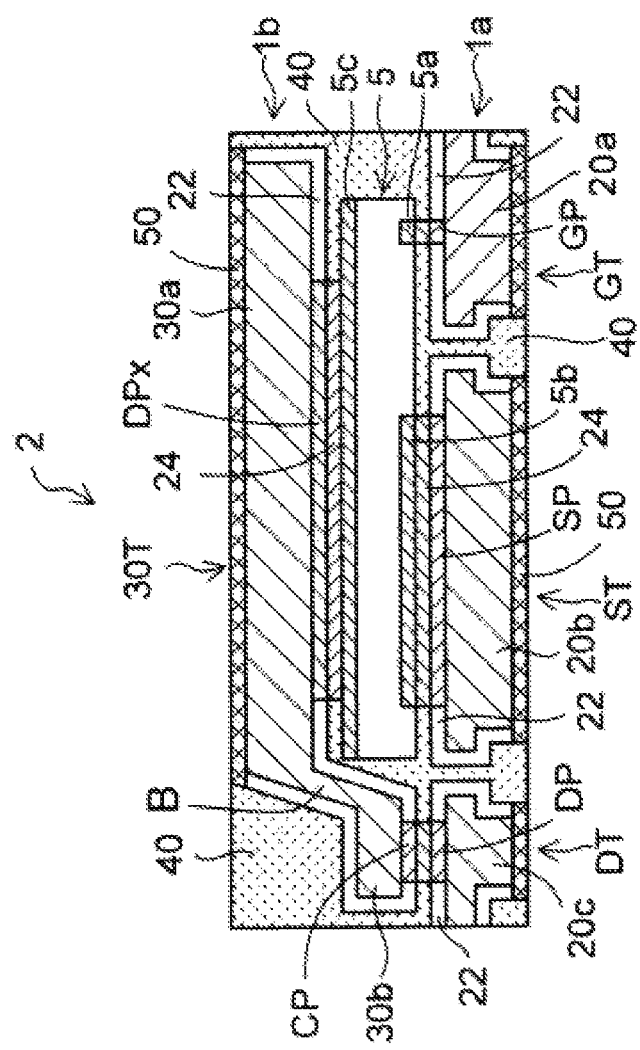
FIG. 28 is a sectional view depicting an electronic component device of the exemplary embodiment.

By the above processes, as shown in FIG. 28, an electronic component device 2 of the exemplary embodiment is manufactured. FIG. 28 depicts a state where the structure of FIG. 27 is cut into individual pieces and is then inverted upside down.

Figure 29:
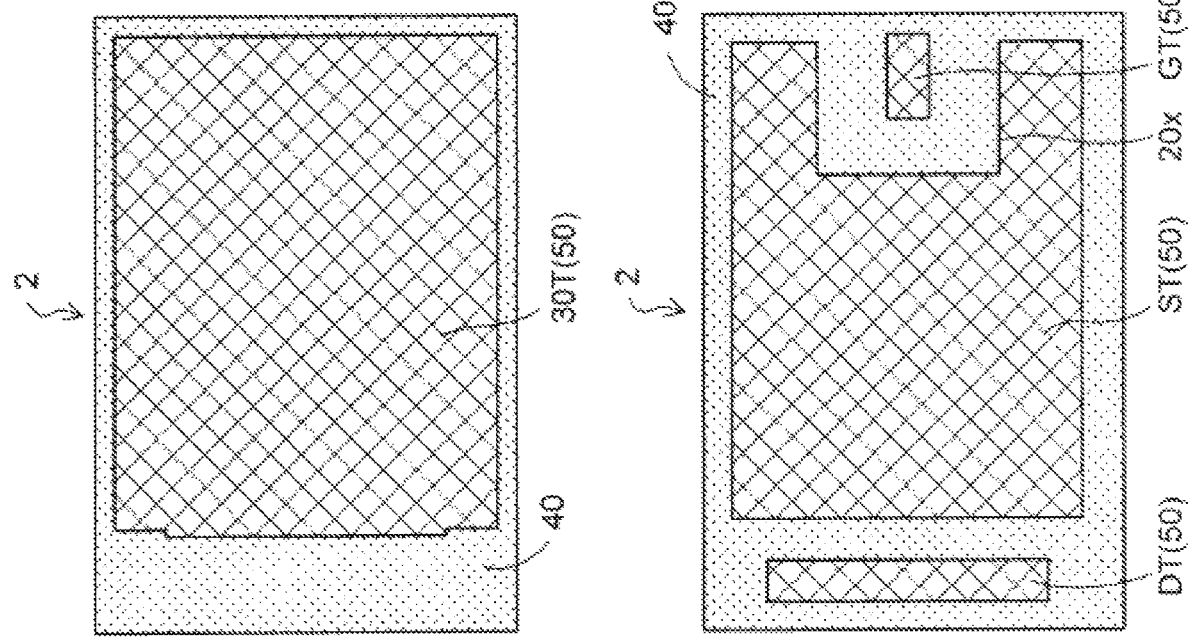
FIGS. 29A and 29B are plan views depicting the electronic component device of the exemplary embodiment.

FIG. 29A is a plan view of the electronic component device 2 of FIG. 28, as seen from above, and FIG. 29B is a plan view of the electronic component device 2 of FIG. 28, as seen from below.

As shown in FIG. 28, the electronic component device 2 of the exemplary embodiment has the lead frame 1a having the connection terminal GT for gate, the connection terminal ST for source and the connection terminal DT for drain shown in FIGS. 4A and 4B, at the lowest part.

The lead frame 1a is an example of the first lead frame. Also, the connection terminal GT for gate, the connection terminal ST for source and the connection terminal DT for drain are examples of the first connection terminal.

The connection terminal GT for gate is configured by the metal electrode 20a, the pad part GP formed on the metal electrode 20a, and the metal oxide layer 22 formed on the upper surface and side surfaces of the metal electrode 20a in the surrounding region of the pad part GP. The pad part GP is formed of the metal plated layer. Also, the lower surface of the metal electrode 20a is formed with the plating layer 50.

Also, the connection terminal ST for source is configured by the metal electrode 20b, the pad part SP formed on the metal electrode 20b, and the metal oxide layer 22 formed on the upper surface and side surfaces of the metal electrode 20b in the surrounding region of the pad part SP. The pad part SP is formed of the metal plated layer. Also, the lower surface of the metal electrode 20b is formed with the plating layer 50.

Likewise, the connection terminal DT for drain is configured by the metal electrode 20c, the pad part DP formed on the metal electrode 20c, and the metal oxide layer 22 formed on the upper surface and side surfaces of the metal electrode 20c in the surrounding region of the pad part DP. The pad part DP is formed of the metal plated layer. Also, the lower surface of the metal electrode 20c is formed with the plating layer 50.

Then power semiconductor chip 5 is mounted on the connection terminal GT for gate and the connection terminal ST for source. The gate terminal part 5a provided on the lower surface-side of the power semiconductor chip 5 is connected to the pad part GP of the connection terminal GT for gate via the solder 24.

Also, the source terminal part 5b provided on the lower surface-side of the power semiconductor chip 5 is connected to the pad part SP of the connection terminal ST for source via the solder 24.

The gate terminal part 5a and the source terminal part 5b provided on the lower surface-side of the power semiconductor chip 5 are examples of the first terminal part provided on the lower surface-side of the electronic component.

The metal oxide layer 22 is respectively formed on the upper surfaces of the metal electrodes 20a, 20b, 20c in the surrounding regions of the respective pad parts GP, SP, DP of the connection terminal GT for gate, the connection terminal ST for source and the connection terminal DT for drain. For this reason, by the above-described principle, the effect of decreasing the activation of the flux by the metal oxide layer 22 is achieved.

Accordingly, the solder 24 formed on the respective pad parts GP, SP, DP remains in the respective pad parts GP, SP, DP when the solder is melted by the reflow heating, so that the outflow of the solder 24 onto the metal oxide layer 22 in the surrounding regions of the respective pad parts is suppressed. In this way, the metal oxide layer 22 is exposed from the solder 24.

Thereby, the electric short due to the outflow of the solder 24 is prevented between the connection terminal GT for gate and the connection terminal ST for source and between the connection terminal ST for source and the connection terminal DT for drain.

As shown in FIG. 28, the lead frame 1b having the relay connection terminal 30T for drain is arranged on the power semiconductor chip 5. The lead frame 1b is an example of the second lead frame. Also, the relay connection terminal 30T for drain is an example of the second connection terminal.

The relay connection terminal 30T for drain has the metal electrode 30a arranged on the power semiconductor chip 5. The metal electrode 30a has the connection part 30b that is coupled to the bent part B bent downward from one end. The lower surface of the connection part 30b is formed thereon with the pad part CP formed of the metal plated layer.

A height position of the connection part 30*b* of the relay connection terminal 30T for drain is lower than a height position of the metal electrode 30*a*, and the pad part CP on the lower surface of the connection part 30*b* is connected to the pad part DP of the connection terminal DT for drain via the solder 24. The power semiconductor chip 5 is accommodated in the accommodation part S, which is provided at the lower side of the metal electrode 30*a* by the bent part B coupled to the connection part 30*b*.

Also, the lower surface of the relay connection terminal 30T for drain is formed at the central portion with the pad part DPx formed of the metal plated layer. The metal oxide layer 22 is formed on the lower surface and side surfaces of the metal electrode 30*a* in each surrounding region of the pad part DPx and the pad part CP. Also, the upper surface of the metal electrode 30*a* is formed with the plating layer 50.

Also, the pad part DPx of the relay connection terminal 30T for drain is connected to the drain terminal part 5*c* provided on the upper surface-side of the power semiconductor chip 5 via the solder 24. The drain terminal part 5*c* provided on the upper surface-side of the power semiconductor chip 5 is an example of the second terminal part provided on the upper surface-side of the electronic component.

Also in the relay connection terminal 30T for drain, the metal oxide layer 22 is formed in each surrounding region of the pad part DPx and the pad part CP. For this reason, the solder 24 is arranged with remaining in the pad part DPx, so that the outflow of the solder 24 to the surrounding region of the pad part DPx is suppressed.

Also, the solder 24 is arranged with remaining in the pad part CP, so that the outflow of the solder 24 to the surrounding region of the pad part CP is suppressed.

Thereby, it is possible to improve the reliability of the electrical connection between the power semiconductor chip 5 and the relay connection terminal 30T for drain.

In this way, the gate terminal part 5*a* provided on the lower surface-side of the power semiconductor chip 5 is connected to the connection terminal GT for gate. Also, the source terminal part 5*b* provided on the lower surface-side of the power semiconductor chip 5 is connected to the connection terminal ST for source. Also, the drain terminal part 5*c* provided on the upper surface-side of the power semiconductor chip 5 is connected to the connection terminal DT for drain via the relay connection terminal 30T for drain.

Also, the seal resin 40 for sealing the power semiconductor chip 5 is filled between the first lead frame 1*a* and the second lead frame 1*b*. The seal resin 40 is filled in each step portion L of the connection terminal GT for gate, the connection terminal ST for source and the connection terminal DT for drain.

Thereby, the connection terminal GT for gate, the connection terminal ST for source and the connection terminal DT for drain are prevented from falling off from the seal resin 40 by the anchor effect of the step portions L.

As shown in FIG. 29B depicting the electronic component device 2 of FIG. 28, as seen from below, the connection terminal ST for source is arranged at the central main part of the lower surface of the electronic component device 2, and the connection terminal ST for source is provided with an opening 20*x* having a notch shape at a side of one end-side.

The rectangular connection terminal GT for gate is arranged in the opening 20*x* of the connection terminal ST for source. Also, the rectangular connection terminal DT for drain is arranged at the other end-side of the electronic component device 2.

The plating layer 50 formed on the lower surfaces of the connection terminal GT for gate, the connection terminal ST for source and the connection terminal DT for drain is exposed from the seal resin 40.

Also, as shown in FIG. 29A depicting the electronic component device 2 of FIG. 28, as seen from above, the rectangular relay connection terminal 30T for drain is arranged on the main part of the upper surface of the electronic component device 2. The plating layer 50 formed on the upper surface of the relay connection terminal 30T for drain is exposed from the seal resin 40.

The connection terminal GT for gate, the connection terminal ST for source and the connection terminal DT for drain of the electronic component device 2 are connected to connection parts of a mount substrate such as a motherboard via solders. At this time, the electronic component device 2 is connected to the mount substrate via a lead-free solder (about 250° C.) having a reflow temperature lower than the solder 24 (Pb/Sn solder) so that the solder 24 in the electronic component device 2 is not to be re-melted.

Figure 30:
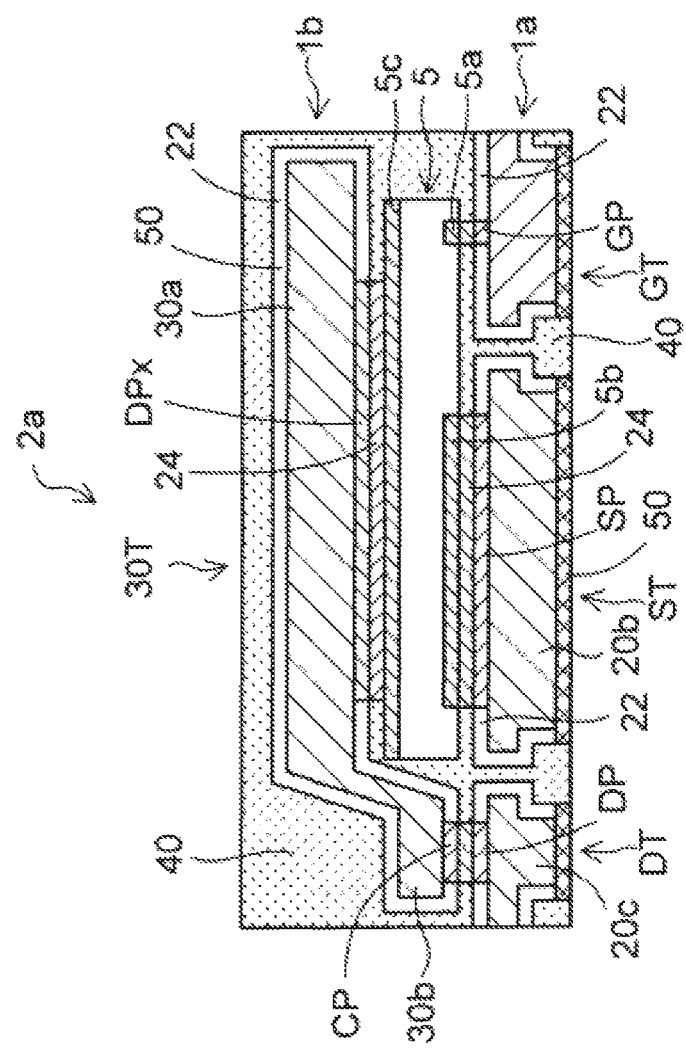
FIG. 30 is a sectional view depicting an electronic component device of a first modified embodiment of the exemplary embodiment.

FIG. 30 depicts an electronic component device 2*a* of a first modified embodiment of the exemplary embodiment. In the electronic component device 2*a* of the first modified embodiment, when forming the seal resin 40 in FIG. 26, the outer surface of the relay connection terminal 30T for drain is covered with the seal resin 40.

Thereby, as shown in FIG. 30, the upper surface of the relay connection terminal 30T for drain is sealed and protected by the seal resin 40. For this reason, when forming the plating layer 50 in FIG. 27, the plating layer 50 is formed only on the connection terminal GT for gate, the connection terminal ST for source and the connection terminal DT for drain.

The relay connection terminal 30T for drain is covered by the seal resin 40 with the metal oxide layer 22 being left on the upper surface-side.

In the electronic component device 2*a* of the first modified embodiment, since the relay connection terminal 30T for drain is insulated from an outside, the unexpected short and the like are prevented.

Figure 31:
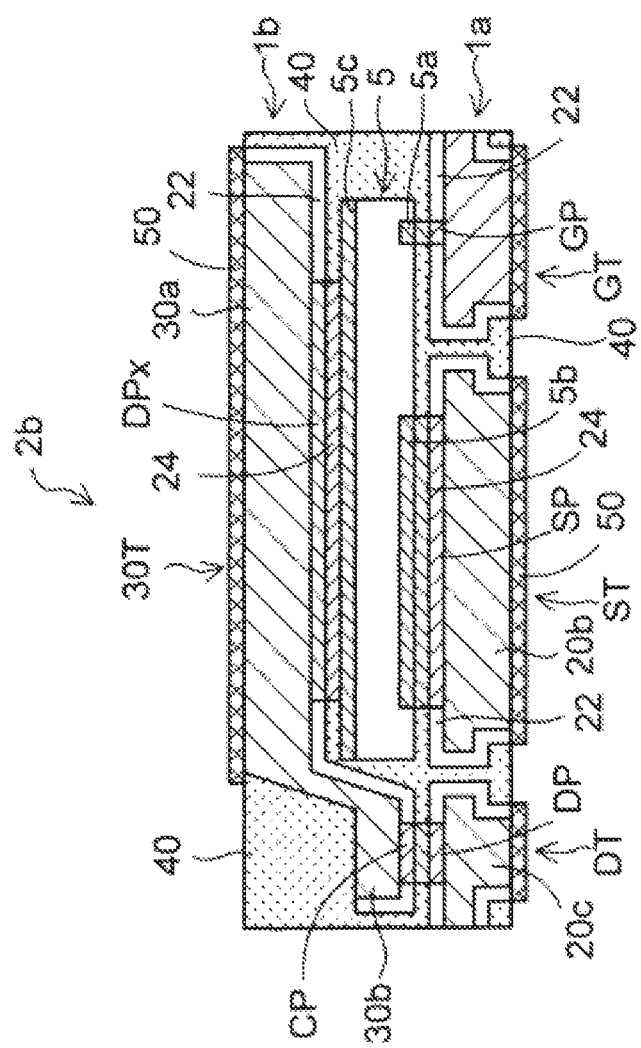
FIG. 31 is a sectional view depicting an electronic component device of a second modified embodiment of the exemplary embodiment.

FIG. 31 depicts an electronic component device 2*b* of a second modified embodiment of the exemplary embodiment. In the electronic component device 2*b* of the second modified embodiment, when forming the metal oxide layer 22 on the lead frame 1*a* in FIG. 13B, the outer surface (the lower surface, in FIG. 13B) on which the plating layer 50 is to be formed is covered with a mask so that the metal oxide layer 22 is not to be formed thereon.

Also, when forming the metal oxide layer 22 on the lead frame 1*b* in FIG. 17B, the outer surface (the lower surface, in FIG. 17B) on which the plating layer 50 is to be formed is covered with a mask so that the metal oxide layer 22 is not to be formed thereon.

Thereby, as shown in FIG. 31, when forming the seal resin 40 in FIG. 26, the lower surfaces of the metal electrodes 20*a*, 20*b*, 20*c* of the lead frame 1*a* are exposed from the seal resin 40 with being flush with the lower surface of the seal resin 40. Also, the upper surface of the metal electrode 30*a* of the lead frame 1*b* is exposed from the seal resin 40 with being flush with the upper surface of the seal resin 40.

Thereafter, the plating layer 50 is formed on the lower surfaces of the metal electrodes 20*a*, 20*b*, 20*c* of the lead frame 1*a* and the upper surface of the metal electrode 30*a* of the lead frame 1*b*.

In this way, when forming the plating layer 50, it is not necessary to remove the metal oxide layer 22 from the respective outer surfaces of the lead frames 1*a*, 1*b*, so that it is possible to simplify the pre-treatment of the plating and to easily form the plating layer 50.

In the electronic component devices 2, 2a, 2b of FIGS. 28, 30 and 31, the first connection terminal (the connection terminals GT, ST, DT for gate, source and drain) is connected to the lower surface-side of the electronic component (the power semiconductor chip 5), and the second connection terminal (the relay connection terminal 30T for drain) is connected to the upper surface-side.

In addition to the above form, an electronic component having a terminal part provided only on the lower surface-side may be connected to the first connection terminal, the second connection terminal may be omitted, and the upper surface-side of the electronic component may be sealed by the seal resin.

Also, an electronic component such as a semiconductor chip having a plurality of bump-shaped terminal parts arranged in an area array type on a lower surface-side may be used, and the plurality of terminal parts of the electronic component may be flip chip-connected to the corresponding pad part of the lead frame via the solder. Also in this case, the electric short and the like, which is caused due to the outflow of the solder between the adjacent terminal parts of the electronic component, are prevented.

This disclosure further encompasses various exemplary embodiments, for example, described below.

1. A manufacturing method of an electronic component device, the manufacturing method comprising:
    patterning a metal plate to form a first metal electrode;
    forming a metal plated layer on an upper surface of the first metal electrode to obtain a first pad part;
    forming a first metal oxide layer on an upper surface of the first metal electrode in a surrounding region of the first pad part to obtain a first lead frame having a first connection terminal comprising the first metal electrode, the first pad part and the first metal oxide layer; and
    connecting a first terminal part provided on a lower surface-side of an electronic component to the first pad part of the first connection terminal via a metal joining material.

2. The manufacturing method of an electronic component device according to claim 1, wherein in the connecting the first terminal part of the electronic component to the first pad part of the first connection terminal via the metal joining material, the metal joining material is arranged in the first pad part and the first metal oxide layer is exposed from the metal joining material.

3. The manufacturing method of an electronic component device according to claim 1 or 2, wherein the obtaining the first lead frame comprises:
    patterning a metal plate to form a second metal electrode,
    forming a metal plated layer on an upper surface of the second metal electrode to obtain a second pad part, and
    forming a second metal oxide layer on an upper surface of the second metal electrode in a surrounding region of the second pad part to obtain a second lead frame having a second connection terminal comprising the second metal electrode, the second pad part and the second metal oxide layer,
    wherein the electronic component has a second terminal part on an upper surface-side, and
    wherein the connecting the first terminal part of the electronic component to the first pad part of the first connection terminal comprises connecting the second pad part of the second connection terminal to the second terminal part of the electronic component via the metal joining material.

4. The manufacturing method of an electronic component device according to claim 3, wherein when connecting the second pad part of the second connection terminal to the second terminal part of the electronic component via the metal joining material, the metal joining material is arranged in the second pad part and the second metal oxide layer is exposed from the metal joining material.

5. The manufacturing method of an electronic component device according to one of claims 1 to 4, wherein in the forming the first metal electrode, the metal plate is a copper plate and the first metal electrode is a copper electrode, and
    wherein in the forming the first metal oxide layer, the copper electrode is anodized to form a copper oxide layer.

What is claimed is:
1. An electronic component device comprising:
    a first lead frame having a first connection terminal, the first connection terminal comprising
        a first metal electrode,
        a first pad part formed on an upper surface of the first metal electrode and formed by a first metal plated layer, and
        a first metal oxide layer formed on the upper surface of the first metal electrode in a surrounding region of the first pad part so as to surround an outer periphery of the first pad part;
    an electronic component having a first terminal part provided on its lower surface, the first terminal part of the electronic component being connected to the first pad part of the first connection terminal via a first metal joining material;
    a seal resin sealing the first lead frame and the electronic component, the seal resin covering the upper surface of the first metal electrode on which the first metal oxide layer is formed; and
    a third metal plating layer formed on a lower surface of the first metal electrode, the lower surface of the first metal electrode being opposite to the upper surface of the first metal electrode,
    wherein at least a portion of the lower surface of the first metal electrode is a first exposed surface which is exposed from the seal resin and the first metal oxide layer, and the third metal plating layer is formed on the first exposed surface.

2. The electronic component device according to claim 1, wherein the first metal joining material is arranged in the first pad part and the first metal oxide layer is exposed from the first metal joining material.

3. The electronic component device according to claim 1, further comprising:
    a second lead frame having a second connection terminal, the second connection terminal comprising
        a second metal electrode,
        a second pad part formed on a lower surface of the second metal electrode and formed by a second metal plated layer,
        a second metal oxide layer formed on the lower surface of the second metal electrode in a surrounding region of the second pad part so as to surround an outer periphery of the second pad part; and
    a fourth metal plating layer formed on an upper surface of the second metal electrode, the upper surface of the second metal electrode being opposite to the lower surface of the second metal electrode,
    wherein
    the electronic component has a second terminal part provided on its upper surface-side, the second pad part of the second connection terminal is connected to the second terminal part of the electronic component by a second metal joining material, the seal resin seals the first lead frame, the second lead frame, and the electronic component, the seal resin covers the lower surface of the second metal electrode on which the second metal oxide layer is formed, and at least a portion of the upper surface of the second metal electrode is a second exposed surface which is exposed from the seal resin and the second metal oxide layer, and the fourth metal plating layer is formed on the second exposed surface.

4. The electronic component device according to claim 3, wherein the second metal joining material is arranged in the second pad part and the second metal oxide layer is exposed from the second metal joining material.

5. The electronic component device according to claim 3,
wherein the electronic component is a power semiconductor chip, wherein the first terminal part of the electronic component is a gate terminal part and a source terminal part of the power semiconductor chip and the second terminal part of the electronic component is a drain terminal part of the power semiconductor chip, wherein the first connection terminal of the first lead frame is a connection terminal for gate, a connection terminal for source and a connection terminal for drain, wherein the gate terminal part and source terminal part of the power semiconductor chip are respectively connected to the connection terminal for gate and the connection terminal for source of the first connection terminal, and wherein the second pad part of the second connection terminal is connected to the drain terminal part of the power semiconductor chip, and a connection part of one end-side of the second connection terminal is connected to the connection terminal for drain of the first connection terminal.

6. The electronic component device according to claim 1, wherein the first metal joining material is a solder.

7. The electronic component device according to claim 3, wherein the second metal joining material is a solder.

8. The electronic component device according to claim 1, wherein the first metal plated layer of the first pad part is a noble metal plated layer.

9. The electronic component device according to claim 1, wherein the first metal oxide layer is an oxide layer formed by oxidation of metal of the first metal electrode.

10. The electronic component device according to claim 1, wherein a surface roughness of the first metal oxide layer is larger than a surface roughness of the first pad part.

11. The electronic component device according to claim 1, wherein the first metal oxide layer has acicular crystals.

12. The electronic component device according to claim 3, wherein the second metal plated layer of the second pad part is a noble metal plated layer.

13. The electronic component device according to claim 3, wherein the second metal oxide layer is an oxide layer formed by oxidation of metal of the second metal electrode.

14. The electronic component device according to claim 3, wherein a surface roughness of the second metal oxide layer is larger than a surface roughness of the second pad part.

15. The electronic component device according to claim 3, wherein the second metal oxide layer has acicular crystals.

16. The electronic component device according to claim 3, wherein the first metal joining material and the second metal joining material are a solder.

17. The electronic component device according to claim 3, wherein the first metal plated layer of the first pad part and the second metal plated layer of the second pad part are noble metal plated layers.

18. The electronic component device according to claim 3, wherein the first metal oxide layer and the second metal oxide layer are oxide layers formed by oxidation of metal of the first metal electrode and the second metal electrode, respectively.

19. The electronic component device according to claim 3, wherein a surface roughness of the first metal oxide layer is larger than a surface roughness of the first pad part, and a surface roughness of the second metal oxide layer is larger than a surface roughness of the second pad part.

20. The electronic component device according to claim 3, wherein the first metal oxide layer and the second metal oxide layer have acicular crystals.

* * * * *